(12) United States Patent
Kimba

(10) Patent No.: US 9,604,337 B2
(45) Date of Patent: Mar. 28, 2017

(54) POLISHING METHOD

(71) Applicant: EBARA CORPORATION, Tokyo (JP)

(72) Inventor: Toshifumi Kimba, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 14/995,143

(22) Filed: Jan. 13, 2016

(65) Prior Publication Data

US 2016/0129546 A1 May 12, 2016

Related U.S. Application Data

(63) Continuation of application No. 14/260,229, filed on Apr. 23, 2014, now Pat. No. 9,266,214.

(30) Foreign Application Priority Data

Apr. 25, 2013 (JP) ................. 2013-092183

(51) Int. Cl.
  B24B 37/00 (2012.01)
  B24B 37/013 (2012.01)
  B24B 49/12 (2006.01)
  H01L 21/306 (2006.01)
(52) U.S. Cl.
  CPC ............ *B24B 37/013* (2013.01); *B24B 49/12* (2013.01); *H01L 21/30625* (2013.01)
(58) Field of Classification Search
  CPC ....... B24B 37/013; B24B 49/12; B24B 49/04; H01L 21/30625
  USPC .......................................................... 451/5
  See application file for complete search history.

(56) References Cited

U.S. PATENT DOCUMENTS

| RE29,138 | E | 2/1977 | Dill et al. |
|---|---|---|---|
| 5,643,050 | A | 7/1997 | Chen |
| 5,667,629 | A | 9/1997 | Pan et al. |
| 5,695,660 | A | 12/1997 | Litvak |
| 6,431,953 | B1 | 8/2002 | Carter et al. |
| 6,641,470 | B1 | 11/2003 | Zhao et al. |
| 6,785,010 | B2 | 8/2004 | Kimba et al. |
| 6,887,126 | B2 | 5/2005 | Brouillette et al. |
| 6,937,939 | B1 * | 8/2005 | Shibusawa ........... G01N 21/314 250/255 |

(Continued)

FOREIGN PATENT DOCUMENTS

| JP | H10-125634 | 5/1998 |
|---|---|---|
| JP | 2004-154928 | 6/2004 |

(Continued)

*Primary Examiner* — George Nguyen
(74) *Attorney, Agent, or Firm* — Baker & Hostetler LLP

(57) ABSTRACT

A method of polishing a substrate is disclosed. The method includes irradiating the substrate with light; measuring intensity of the reflected light; producing spectral waveform representing relationship between relative reflectance and wavelength of the light; performing a Fourier transform process on the spectral waveform to determine a thickness of the film and a corresponding strength of frequency component; determining whether the determined thickness of the film is reliable or not by comparing the strength of frequency component with a threshold value; calculating a defective data rate representing a proportion of the number of unreliable measured values to the total number of measured values; and changing the threshold value based on the defective data rate.

9 Claims, 16 Drawing Sheets

(56) References Cited

U.S. PATENT DOCUMENTS

| | | | |
|---|---|---|---|
| 7,252,575 B2 | 8/2007 | Kobayashi et al. | |
| 8,563,335 B1 | 10/2013 | Benvegnu et al. | |
| 9,266,214 B2 * | 2/2016 | Kimba | B24B 37/013 |
| 2001/0052987 A1 | 12/2001 | Kimba et al. | |
| 2002/0115380 A1 | 8/2002 | Yamane et al. | |
| 2004/0016895 A1 | 1/2004 | Amartur | |
| 2004/0117146 A1 | 6/2004 | Liu et al. | |
| 2006/0063472 A1 | 3/2006 | Matsumoto et al. | |
| 2006/0261975 A1 * | 11/2006 | Fridthjof | B60T 8/172 340/905 |
| 2008/0268751 A1 | 10/2008 | Yokoyama et al. | |
| 2009/0174017 A1 | 7/2009 | Sumi | |
| 2010/0015889 A1 | 1/2010 | Shimizu et al. | |
| 2010/0056023 A1 | 3/2010 | David et al. | |
| 2010/0093260 A1 | 4/2010 | Kobayashi et al. | |
| 2011/0312103 A1 * | 12/2011 | Fujimaki | G01N 33/54373 436/501 |
| 2012/0034845 A1 | 2/2012 | Hu et al. | |
| 2012/0276817 A1 | 11/2012 | Iravani et al. | |
| 2012/0293188 A1 | 11/2012 | Nikolenko et al. | |
| 2013/0109278 A1 | 5/2013 | Kimba | |
| 2014/0220862 A1 * | 8/2014 | Koike | B24B 37/013 451/5 |

FOREIGN PATENT DOCUMENTS

| | | |
|---|---|---|
| JP | 2005-101114 A | 4/2005 |
| JP | 2010-016016 A | 1/2010 |

\* cited by examiner

FIG. 7

| | 1-st ROTATION | | | 2-nd ROTATION | | | 3-rd ROTATION | | | 4-th ROTATION | | | 5-th ROTATION | | |
|---|---|---|---|---|---|---|---|---|---|---|---|---|---|---|---|
| | THICKNESS | STRENGTH | EVALUATION | THICKNESS | STRENGTH | EVALUATION | THICKNESS | STRENGTH | EVALUATION | THICKNESS | STRENGTH | EVALUATION | THICKNESS | STRENGTH | EVALUATION |
| | 4299 | 1.8 | ○ | 4191 | 1.8 | ○ | 3987 | 1.6 | ○ | 5634 | 0.5 | × | 2122 | 0.2 | × |
| | 4059 | 1.4 | ○ | 3902 | 1.8 | ○ | 43554 | 0.3 | × | 9541 | 0.6 | × | 4087 | 1.9 | ○ |
| | 1059 | 0.5 | × | 5009 | 0.3 | ○ | 4102 | 1.6 | ○ | 4023 | 1.7 | ○ | 3852 | 1.6 | ○ |
| | 3899 | 1.5 | ○ | 4211 | 1.7 | ○ | 3940 | 1.6 | ○ | 3866 | 1.7 | ○ | 3902 | 0.7 | × |
| | 4030 | 1.8 | ○ | 3840 | 1.4 | ○ | 1230 | 0.4 | × | 3911 | 1.3 | ○ | 1951 | 0.3 | × |

POLISHING METHOD

CROSS REFERENCE TO RELATED APPLICATION

This application is a continuation of U.S. application Ser. No. 14/260,229 filed Apr. 23, 2014, which claims priority to Japanese Patent Application No. 2013-092183 filed Apr. 25, 2013, the entire contents of which are hereby incorporated by reference.

BACKGROUND

Semiconductor devices are fabricated through several processes including a process of polishing a dielectric film, e.g., $SiO_2$, and a process of polishing a metal film, e.g., copper or tungsten. Fabrication processes of backside illumination CMOS sensor and through-silicon via (TSV) include a process of polishing a silicon layer (silicon wafer), in addition to the polishing processes of the dielectric film and the metal film.

Polishing of the wafer is terminated when a thickness of a film (e.g., the dielectric film, the metal film, or the silicon layer), constituting a wafer surface, has reached a predetermined target value. CMP (Chemical Mechanical Polishing) apparatus is used for polishing the wafer. FIG. 1 is a schematic view of the CMP apparatus. The CMP apparatus includes a polishing table 101 with a polishing pad 100 attached to an upper surface thereof, a top ring 110 for holding a wafer W, a slurry supply nozzle 115 for supplying a polishing liquid (slurry) onto the polishing pad 100, and a film-thickness measuring device 120 for measuring a film thickness of the wafer W. The film-thickness measuring device 120 is embedded in the polishing table 101.

The top ring 110 and the polishing table 101 rotate as indicated by arrows. In this state, the top ring 110 presses the wafer W against the polishing pad 100, while the slurry supply nozzle 115 supplies the polishing liquid onto the polishing pad 100. The wafer W is polished by sliding contact with the polishing pad 100 in the presence of the polishing liquid. During polishing of the wafer W, the film-thickness measuring device 120 rotates together with the polishing table 101 and measures the film thickness while sweeping a surface of the wafer W as indicated by arrow A. Polishing of the wafer W is terminated when the film thickness has reached the predetermined target value.

An optical film-thickness measuring device is one example of the film-thickness measuring device 120 used in the above-described CMP apparatus. This optical film-thickness measuring device is designed to illuminate the surface of the wafer with light and analyze reflected light from the wafer to determine a thickness of a film formed on the surface of the wafer.

However, the film-thickness measuring device incorporated in the CMP apparatus may fail to measure the thickness if there is a variation in the thickness of the film because it measures the thickness of the film while the device itself is moving as shown in FIG. 1. Moreover, since the film is scraped away every time the polishing table makes one revolution, it is impossible to measure the thickness at the same position under the same conditions.

SUMMARY OF THE INVENTION

It is therefore an object to provide a polishing method and a polishing apparatus capable of obtaining an accurate thickness of a film (e.g., the dielectric film, the metal film, or the silicon layer) formed on the substrate during polishing of the substrate and capable of accurately determining a substrate polishing end point based on the thickness of the film obtained.

Embodiments, which will be described below, relate to a method and an apparatus for polishing a substrate having a film forming a surface thereof, and more particularly to a polishing method and a polishing apparatus capable of detecting a polishing end point of the substrate based on optical information contained in reflected light from the substrate.

In an embodiment, a method of polishing a substrate having a film, includes: polishing the substrate by pressing the substrate against a polishing tool on a rotating polishing table; irradiating the substrate with light when polishing the substrate; receiving the light reflected from the substrate; measuring intensity of the reflected light at respective wavelengths; calculating relative reflectance by dividing the measured intensity of the light by predetermined reference intensity; producing spectral waveform representing relationship between the relative reflectance and wavelength of the light; performing a Fourier transform process on the spectral waveform to determine a thickness of the film and a corresponding strength of frequency component; determining that the determined thickness of the film is a reliable measured value if the strength of frequency component is higher than a predetermined threshold value; determining that the determined thickness of the film is an unreliable measured value if the strength of frequency component is equal to or lower than the predetermined threshold value; determining a polishing end point of the substrate based on a point of time when the reliable measured value has reached a predetermined target value; calculating a defective data rate representing a proportion of the number of unreliable measured values to the total number of reliable measured values and unreliable measured values that have been obtained previously; and changing the threshold value based on the defective data rate.

In an embodiment, a method of polishing a substrate having a film, includes: polishing the substrate by pressing the substrate against a polishing tool on a rotating polishing table; irradiating the substrate with light when polishing the substrate; receiving the light reflected from the substrate; measuring intensity of the reflected light at respective wavelengths; calculating relative reflectance by dividing the measured intensity of the light by predetermined reference intensity; producing spectral waveform representing relationship between the relative reflectance and wavelength of the light; performing a Fourier transform process on the spectral waveform to determine a thickness of the film and a corresponding strength of frequency component; determining that the determined thickness of the film is a reliable measured value if the strength of frequency component is higher than a predetermined threshold value; determining that the determined thickness of the film is an unreliable measured value if the strength of frequency component is equal to or lower than the predetermined threshold value; calculating a defective data rate representing a proportion of the number of unreliable measured values to the total number of reliable measured values and unreliable measured values that have been obtained previously; and determining a polishing end point of the substrate based on a point of time when the reliable measured value has reached a predetermined target value, wherein the polishing end point is not determined from the beginning of polishing of the substrate until the defective data rate is lowered than a predetermined reference value.

In an embodiment, a method of polishing a substrate having a film, includes: polishing the substrate by pressing the substrate against a polishing tool on a rotating polishing table; irradiating the substrate with light when polishing the substrate; receiving the light reflected from the substrate; measuring intensity of the reflected light at respective wavelengths; calculating relative reflectance by dividing the measured intensity of the light by predetermined reference intensity; producing spectral waveform representing relationship between the relative reflectance and wavelength of the light; performing a Fourier transform process on the spectral waveform to determine a thickness of the film and a corresponding strength of frequency component; determining that the determined thickness of the film is a reliable measured value if the strength of frequency component is higher than a predetermined threshold value; determining that the determined thickness of the film is an unreliable measured value if the strength of frequency component is equal to or lower than the predetermined threshold value; calculating a defective data rate representing a proportion of the number of unreliable measured values to the total number of reliable measured values and unreliable measured values that have been obtained previously; determining a polishing end point of the substrate based on a point of time when the reliable measured value has reached a predetermined target value; and emitting an alarm signal if the defective data rate has reached a predetermined upper limit during polishing of the substrate.

In an embodiment, a method of polishing a substrate having a multilayer structure including a first film and a second film, includes: polishing the substrate by pressing the substrate against a polishing tool on a rotating polishing table; irradiating the substrate with light when polishing the substrate; receiving the light reflected from the substrate; measuring intensity of the reflected light at respective wavelengths; calculating relative reflectance by dividing the measured intensity of the light by predetermined reference intensity; producing spectral waveform representing relationship between the relative reflectance and wavelength of the light; performing a Fourier transform process on the spectral waveform to determine a thickness of the first film, a strength of frequency component corresponding to the thickness of the first film, a thickness of the second film, and a strength of frequency component corresponding to the thickness of the second film; determining that the determined thickness of the first film is a reliable measured value if a difference between the strength of frequency component corresponding to the thickness of the first film and the strength of frequency component corresponding to the thickness of the second film is larger than a preset value; and determining a polishing end point of the substrate based on a point of time when the reliable measured value has reached a predetermined target value.

In an embodiment, an apparatus for polishing a substrate having a film, includes: a rotatable polishing table for supporting a polishing tool thereon; a top ring configured to press the substrate against the poling tool on the rotating polishing table; an irradiator configured to irradiate the substrate with light when the substrate is held by the top ring; an optical receiver configured to receive the light reflected from the substrate; a spectroscope configured to measure intensity of the reflected light at respective wavelengths; and a polishing monitoring unit configured to determine a thickness of the film from light intensity data obtained by the spectroscope, wherein the polishing monitoring unit is configured to calculate relative reflectance by dividing the measured intensity of the light by predetermined reference intensity, produce spectral waveform representing relationship between the relative reflectance and wavelength of the light, perform a Fourier transform process on the spectral waveform to determine a thickness of the film and a corresponding strength of frequency component, determine that the determined thickness of the film is a reliable measured value if the strength of frequency component is higher than a predetermined threshold value, determine that the determined thickness of the film is an unreliable measured value if the strength of frequency component is equal to or lower than the predetermined threshold value, determine a polishing end point of the substrate based on a point of time when the reliable measured value has reached a predetermined target value, calculate a defective data rate representing a proportion of the number of unreliable measured values to the total number of reliable measured values and unreliable measured values that have been obtained previously, and change the threshold value based on the defective data rate.

In an embodiment, an apparatus for polishing a substrate having a film, includes: a rotatable polishing table for supporting a polishing tool thereon; a top ring configured to press the substrate against the poling tool on the rotating polishing table; an irradiator configured to irradiate the substrate with light when the substrate is held by the top ring; an optical receiver configured to receive the light reflected from the substrate; a spectroscope configured to measure intensity of the reflected light at respective wavelengths; and a polishing monitoring unit configured to determine a thickness of the film from light intensity data obtained by the spectroscope, wherein the polishing monitoring unit is configured to calculate relative reflectance by dividing the measured intensity of the light by predetermined reference intensity, produce spectral waveform representing relationship between the relative reflectance and wavelength of the light, perform a Fourier transform process on the spectral waveform to determine a thickness of the film and a corresponding strength of frequency component, determine that the determined thickness of the film is a reliable measured value if the strength of frequency component is higher than a predetermined threshold value, determine that the determined thickness of the film is an unreliable measured value if the strength of frequency component is equal to or lower than the predetermined threshold value, calculate a defective data rate representing a proportion of the number of unreliable measured values to the total number of reliable measured values and unreliable measured values that have been obtained previously, and determine a polishing end point of the substrate based on a point of time when the reliable measured value has reached a predetermined target value, wherein the polishing monitoring unit is configured not to determine the polishing end point from the beginning of polishing of the substrate until the defective data rate is lowered than a predetermined reference value.

In an embodiment, an apparatus for polishing a substrate having a film, includes: a rotatable polishing table for supporting a polishing tool thereon; a top ring configured to press the substrate against the poling tool on the rotating polishing table; an irradiator configured to irradiate the substrate with light when the substrate is held by the top ring; an optical receiver configured to receive the light reflected from the substrate; a spectroscope configured to measure intensity of the reflected light at respective wavelengths; and a polishing monitoring unit configured to determine a thickness of the film from light intensity data obtained by the spectroscope, wherein the polishing monitoring unit is configured to calculate relative reflectance by dividing the measured intensity of the light by predetermined reference intensity, produce spectral waveform representing relationship between the relative reflectance and wavelength of the light, perform a Fourier transform process on the spectral waveform to determine a thickness of the film and a corresponding strength of frequency component, determine that the determined thickness of the film is a reliable measured value if the strength of frequency component is higher than a predetermined threshold value, determine that the determined thickness of the film is an unreliable measured value if the strength of frequency component is equal to or lower than the predetermined threshold value, calculate a defective data rate representing a proportion of the number of unreliable measured values to the total number of reliable measured values and unreliable measured values that have been obtained previously, determine a polishing end point of the substrate based on a point of time when the reliable measured value has reached a predetermined target value, and emit an alarm signal if the defective data rate has reached a predetermined upper limit during polishing of the substrate.

In an embodiment, an apparatus for polishing a substrate having a multilayer structure including a first film and a second film, includes: a rotatable polishing table for supporting a polishing tool thereon; a top ring configured to press the substrate against the poling tool on the rotating polishing table; an irradiator configured to irradiate the substrate with light when the substrate is held by the top ring; an optical receiver configured to receive the light reflected from the substrate; a spectroscope configured to measure intensity of the reflected light at respective wavelengths; and a polishing monitoring unit configured to determine a thickness of the first film from light intensity data obtained by the spectroscope, wherein the polishing monitoring unit is configured to calculate relative reflectance by dividing the measured intensity of the light by predetermined reference intensity, produce spectral waveform representing relationship between the relative reflectance and wavelength of the light, perform a Fourier transform process on the spectral waveform to determine a thickness of the first film, a strength of frequency component corresponding to the thickness of the first film, a thickness of the second film, and a strength of frequency component corresponding to the thickness of the second film, determine that the determined thickness of the first film is a reliable measured value if a difference between the strength of frequency component corresponding to the thickness of the first film and the strength of frequency component corresponding to the thickness of the second film is larger than a preset value, and determine a polishing end point of the substrate based on a point of time when the reliable measured value has reached a predetermined target value.

In an embodiment, a method of polishing a substrate having a film, includes: polishing the substrate by pressing the substrate against a polishing tool on a rotating polishing table; irradiating the substrate with light when polishing the substrate; calculating relative reflectance from intensity of the light reflected from the substrate; producing spectral waveform representing relationship between the relative reflectance and wavelength of the light; determining a thickness of the film; and determining whether the thickness of the film is reliable or not based on the relative reflectance.

According to the above-described embodiments, the following effects can be obtained.

(1) Measured values each accurately reflecting the thickness of the film, i.e., reliable measured values, can be obtained based on the comparison between the strength of the frequency component and the predetermined threshold value. Therefore, an accurate polishing end point can be detected from the measured values obtained.

(2) The above-described threshold value is changed in accordance with the defective data rate representing a proportion of the number of unreliable measured values to the total number of reliable measured values and unreliable measured values that have been obtained previously. As a result, more reliable measured values can be obtained. Therefore, an accurate polishing end point can be detected from the measured values obtained.

(3) When a wafer having a rough surface is polished, the measured value of the film thickness tends to fluctuate at an initial stage of polishing. According to the above described embodiment, the polishing end point detection is performed after the defective data rate is lowered below the predetermined reference value. Therefore, an accurate polishing end point can be detected.

(4) If the defective data rate has reached the predetermined upper limit during polishing of the substrate, the alarm signal is emitted. Therefore, a detection failure of the polishing end point can be prevented.

BRIEF DESCRIPTION OF THE DRAWINGS

FIG. 7 is a table showing measurement data obtained when polishing a wafer having backside illumination (BSI) image sensor formed thereon;

DETAILED DESCRIPTION OF EMBODIMENTS

Figure 1:
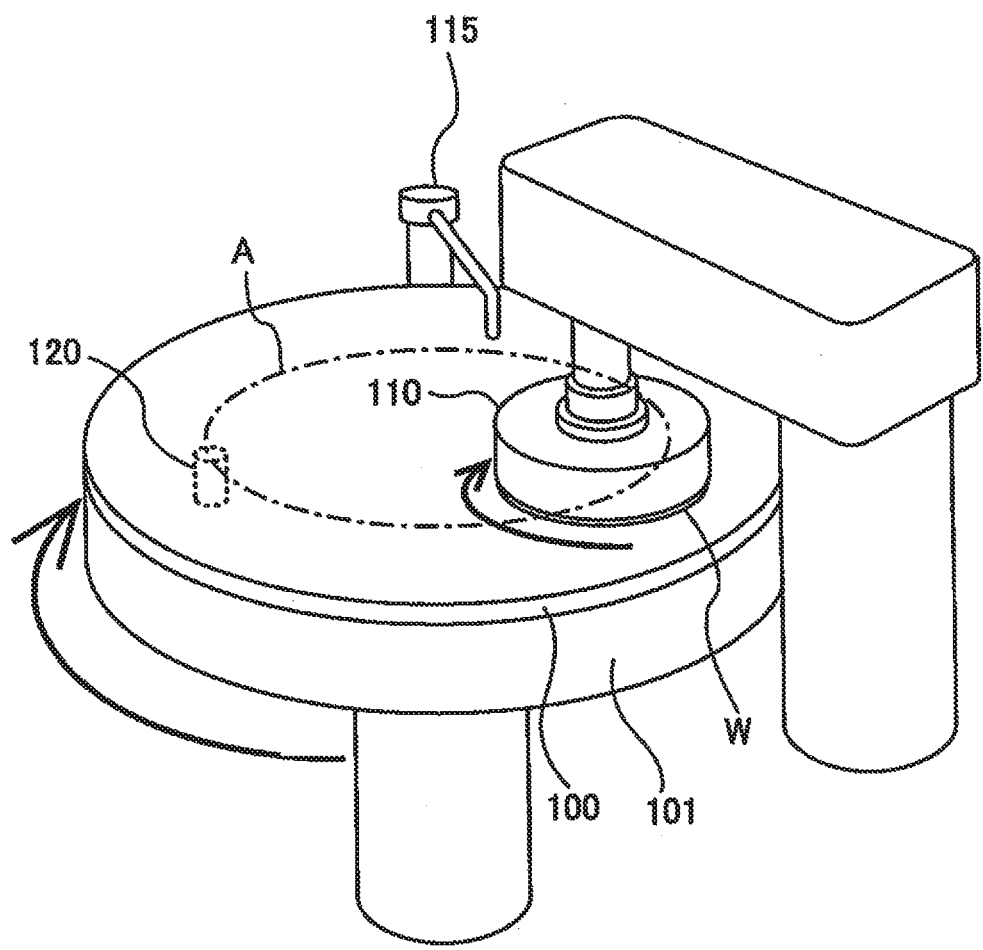
FIG. 1 is a schematic view of a CMP apparatus.
Figure 2:
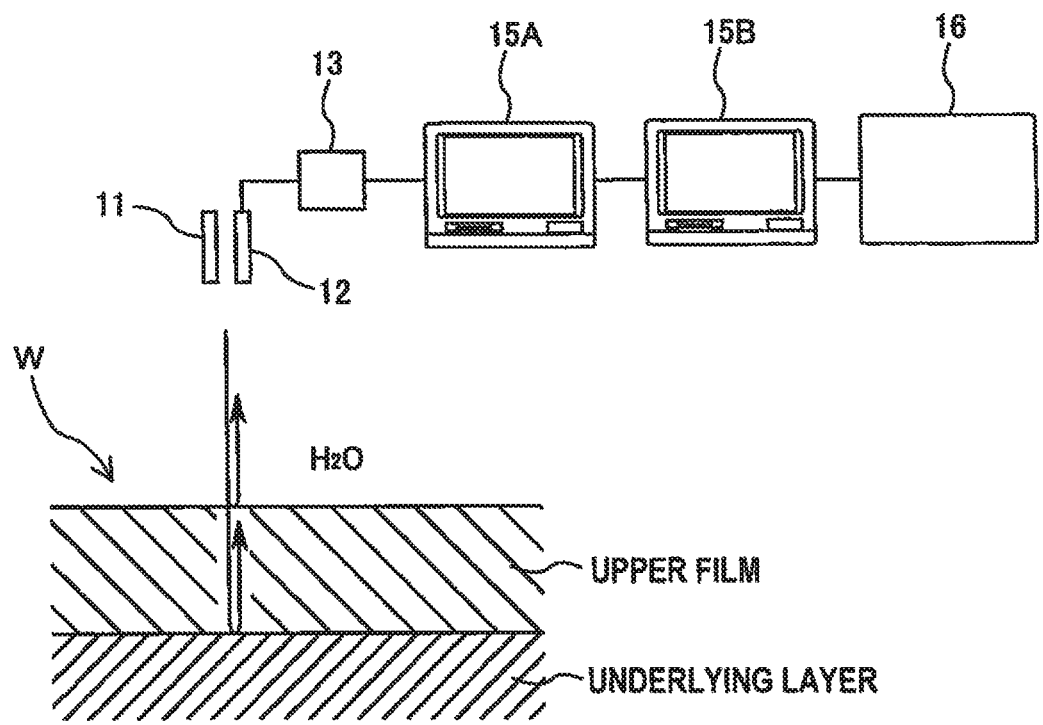
FIG. 2 is a schematic view for illustrating the principle of an optical polishing end point detection method.
Figure 3:
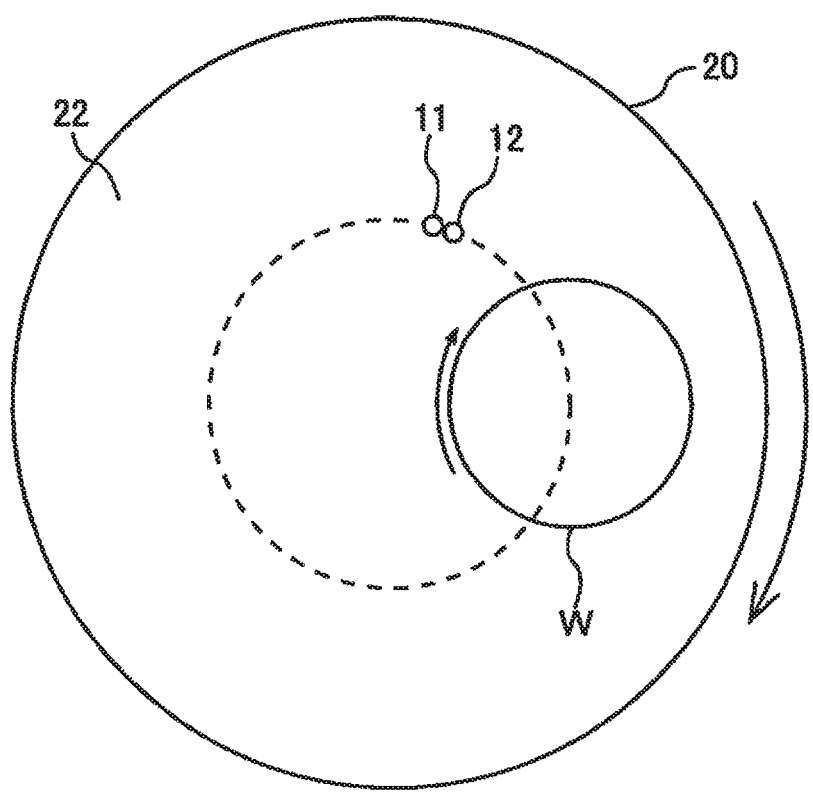
FIG. 3 is a plan view showing positional relationship between wafer and polishing table.

Embodiments of the present invention will be described below with reference to the drawings. FIG. 2 is a schematic view for illustrating the principle of an optical polishing end point detection method, and FIG. 3 is a plan view showing positional relationship between wafer and polishing table. As shown in FIG. 2, a wafer W has an underlying layer and a film formed on the underlying layer. The wafer W is held by a top ring (not shown in FIGS. 2 and 3) and rotated about its central axis as shown in FIG. 3. A surface of the wafer W is pressed by the top ring against a polishing pad 22 on a rotating polishing table 20, so that the film of the wafer W is polished by sliding contact with the polishing pad 22, which is a polishing tool having a polishing surface for polishing the wafer W. A grindstone (or fixed abrasive) may be used as the polishing tool, instead of the polishing pad 22.

An irradiator 11 and an optical receiver 12 are disposed in the polishing table 20 and are arranged so as to face the surface of the wafer W. The irradiator 11 has a light source (not shown) for emitting light and is configured to direct the light to the surface of the wafer W. Each time the polishing table 20 makes one revolution, multiple regions, including the center of the wafer W, are irradiated with the light.

The optical receiver 12 is configured to receive the light reflected from the wafer W. A spectroscope 13 is coupled to the optical receiver 12. This spectroscope 13 resolves the reflected light according to wavelength and measures intensity of the reflected light at each of wavelengths. A first processor 15A is coupled to the spectroscope 13. This first processor 15A is configured to read intensity data of the light obtained by the spectroscope 13 and create intensity distribution of the reflected light. More specifically, the first processor 15A produces spectral waveform that represents intensities of the light at the respective wavelengths. This spectral waveform is expressed as line graph (i.e., waveform) showing relationship between wavelength and intensity of the light.

The light, directed to the wafer W, is reflected off an interface between a medium (e.g., water in the example of FIG. 2) and the film and an interface between the film and the underlying layer beneath the film. The lights from these interfaces interfere with each other. The manner of interference between the lights varies according to the thickness of the film (i.e., a length of an optical path). As a result, the spectral waveform produced from the reflected light from the wafer varies according to the thickness of the film. The first processor 15A performs FFT (fast Fourier transform) process on the spectral waveform to analyze the spectral waveform and determines a current thickness of the film from the analysis result. As shown in FIG. 2, in a case where the film to be polished is a silicon layer and water is used as the medium, it is preferable to use light having a wavelength of not more than 1100 nm in order to prevent the light from being absorbed into the water.

The first processor 15A is coupled to a second processor 15B. A value of the thickness of the film determined by the first processor 15A is sent to the second processor 15B. This second processor 15B is configured to compare the thickness of the film with a predetermined target value and determine whether or not the thickness of the film has reached the target value. If the thickness of the film has reached the target value, the second processor 15B judges that polishing of the film has reached its end point and sends a polishing end point detection signal to an operation controller 16 of a polishing apparatus (CMP apparatus). Upon receiving the polishing end point detection signal, the operation controller 16 terminates the wafer polishing operation. In this embodiment, the first processor 15A and the second processor 15B constitute a polishing monitoring unit. The first processor 15A and the second processor 15B may be unified into one processor.

Figure 4:
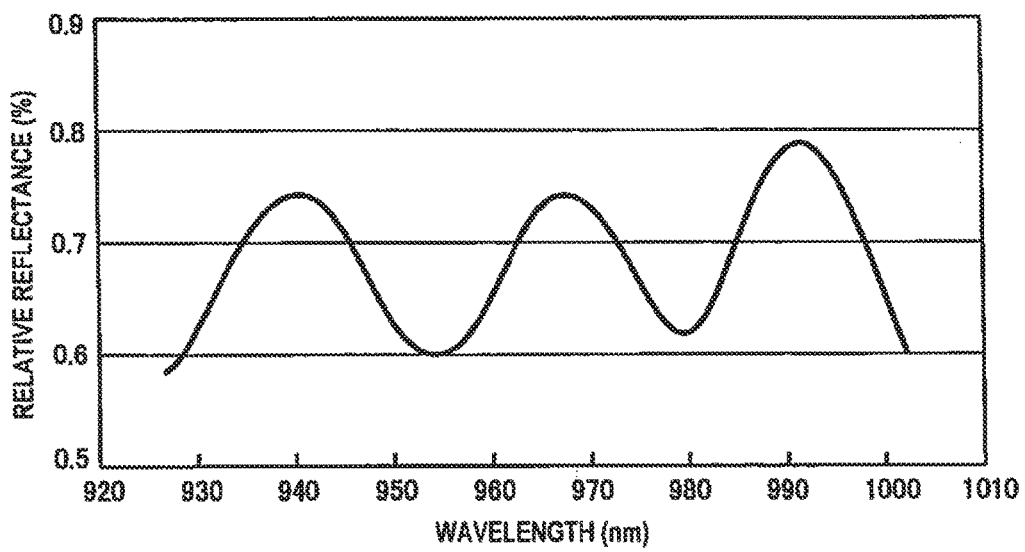
FIG. 4 is a diagram showing spectral waveform created by a first processor.

Hereinafter, the first processor 15A will be described in more detail. FIG. 4 is a diagram showing spectral waveform created by the first processor 15A. In FIG. 4, horizontal axis represents wavelength of the light reflected from the wafer, and vertical axis represents relative reflectance derived from the intensity of the light. The relative reflectance is an index that represents the reflection intensity of the light. More specifically, the relative reflectance is a ratio of the intensity of the light to a predetermined corresponding reference intensity. By dividing intensities of the light (i.e., the actually measured intensity) at the respective wavelengths by predetermined reference intensities, unwanted noise, such as a variation in the intensity inherent in an optical system or light source of the apparatus, are removed from the actually measured intensity. As a result, the spectral waveform reflecting only the thickness information of the silicon layer can be obtained. In the example shown in FIG. 4, the film to be polished is a silicon layer, and infrared ray is used as the light illuminating the wafer.

The reference intensity is an intensity that has been obtained in advance at each of the wavelengths. The relative reflectance is calculated at each of the wavelengths. Specifically, the relative reflectance is determined by dividing the intensity of the light (the actual intensity) at each wavelength by the corresponding reference intensity. The reference intensity may be an intensity of the reflected light obtained when a silicon wafer (bare wafer) with no film thereon is being polished in the presence of water. In the actual polishing process, a dark level (which is a background intensity obtained under the condition that the light is cut off) is subtracted from the actually measured intensity to determine a corrected actually measured intensity. Further, the dark level is subtracted from the reference intensity to determine a corrected reference intensity. Then the relative reflectance is calculated by dividing the corrected actually measured intensity by the corrected reference intensity. That is, the relative reflectance $R(\lambda)$ can be calculated by using $$R(\lambda) = \frac{E(\lambda) - D(\lambda)}{B(\lambda) - D(\lambda)}$$

where $\lambda$ is wavelength, $E(\lambda)$ is the intensity of the light reflected from the wafer at the wavelength $\lambda$, $B(\lambda)$ is the reference intensity at the wavelength λ, and D(λ) is the background intensity (i.e., dark level) at the wavelength λ obtained under the condition that the wafer does not exist.

The first processor 15A performs the fast Fourier transform (or Fourier transform) process on the obtained spectral waveform to analyze the spectral waveform. More specifically, the first processor 15A extracts frequency components and strengths thereof from the spectral waveform, converts the frequency components obtained into thicknesses of the film using a predetermined relational expression, and produces a frequency spectrum that represents relationship between the thickness of the film and the strength of the frequency component. The above-mentioned predetermined relational expression is a linear function representing the thickness of the film and having the frequency component as variable. This linear function can be obtained from actual measurement results or the like.

Figure 5:
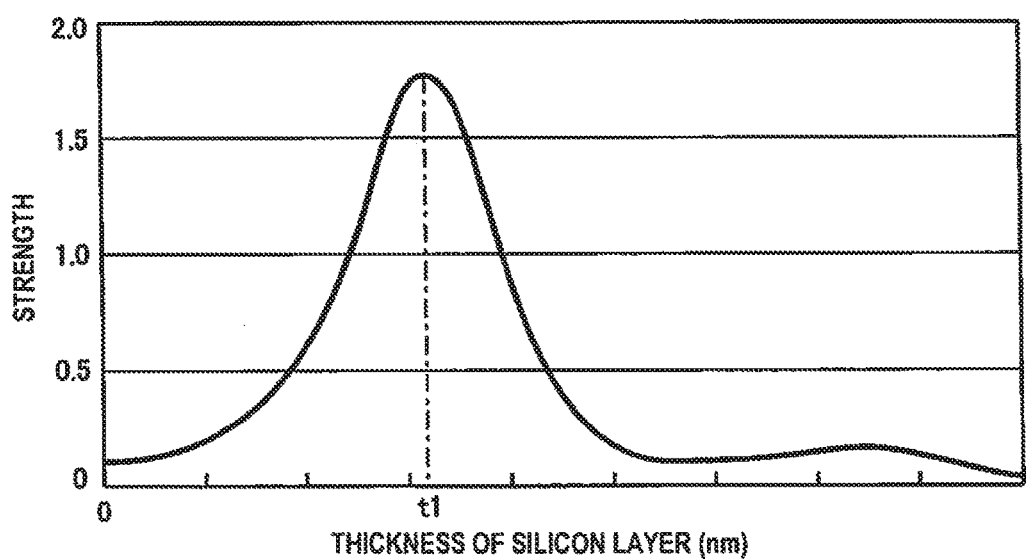
FIG. 5 is a diagram showing frequency spectrum created by the first processor.

FIG. 5 is a diagram showing the frequency spectrum produced by the first processor 15A. In FIG. 5, vertical axis represents strength of the frequency component contained in the spectral waveform, and horizontal axis represents thickness of the film. As can be seen from FIG. 5, the strength reaches its maximum at the thickness of t1. That is, this frequency spectrum indicates that the thickness of the film is t1. In this manner, the thickness of the film is determined from a peak of the frequency spectrum.

Figure 6:
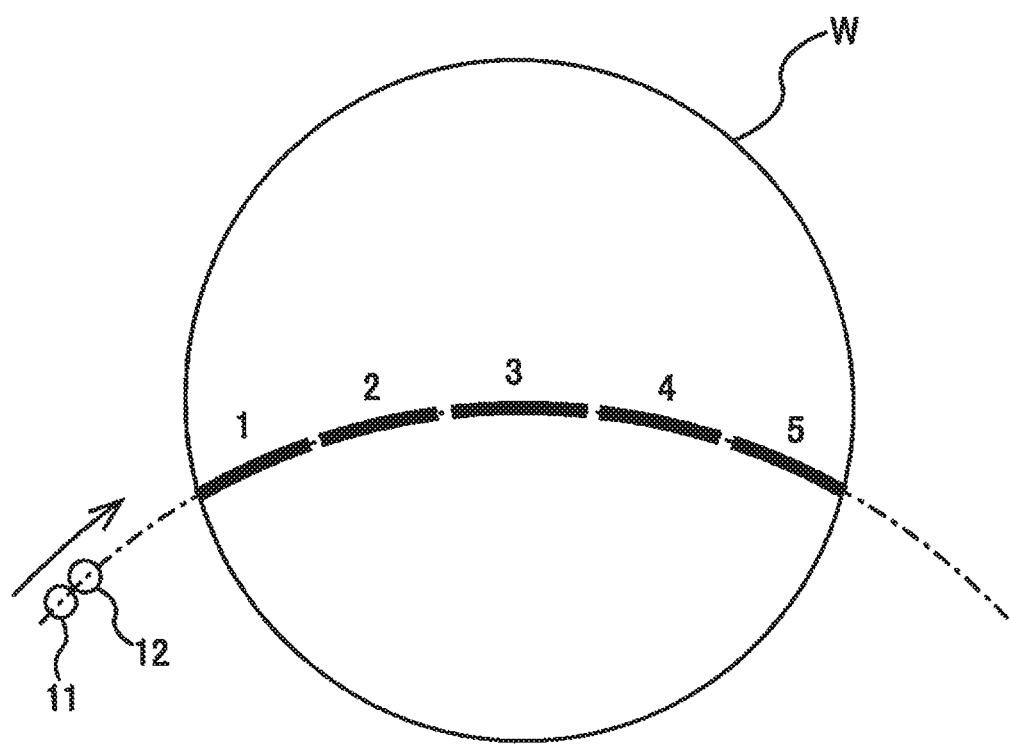
FIG. 6 is a diagram showing an example in which measuring operation is performed five times while the polishing table is making one revolution.

It is preferable to measure the thickness of the film several times while the polishing table 20 is making one revolution. One measuring time depends on an exposure time of the wafer W, i.e., a time during which the wafer W is exposed to the light. Therefore, the number of measuring operations conducted while the polishing table 20 is making one revolution is determined from the exposure time, the rotational speed of the polishing table 20, and the rotational speed of the top ring. FIG. 6 is a diagram showing an example in which the measuring operation is performed five times while the polishing table 20 is making one revolution under the condition that the rotational speed of the polishing table 20 and the rotational speed of the top ring are approximately the same. As shown in FIG. 6, tips of the irradiator 11 and the optical receiver 12 pass across the center of the wafer W when sweeping the wafer W. During the sweep across the wafer W, five measuring operations are performed. Therefore, each time the polishing table 20 makes one revolution, five measured values, each representing the thickness of the film, are obtained. These measured values are sent from the first processor 15A to the second processor 15B, which determines the polishing end point based on the measured values of the thickness of the film.

As discussed above, several measured values are obtained during one revolution of the polishing table 20. However, some of the measured values may not represent the thickness of the film accurately. Possible causes of such unreliable measured values include relatively large steps existing on the surface of the film which are measured together with other regions through one measuring operation and lack of a quantity of light reflected from the wafer due to some reasons.

FIG. 7 is a table showing measurement data obtained when polishing a wafer having backside illumination (BSI) image sensor formed thereon. In the example shown in FIG. 7, the film to be polished is a silicon layer. Typically, in the fabrication process of the backside illumination image sensor, a silicon layer having a thickness of less than about 10 µm is polished. As can be seen from FIG. 7, each time the polishing table 20 makes one revolution, five measured values each indicating the silicon layer thickness and five values each indicating the strength of the frequency component corresponding respectively to these measured values are obtained.

However, the measured value with a low strength tends to differ greatly from other measured values. In other words, the measured value with a low strength of the frequency component does not accurately represent the actual thickness of the silicon layer. Thus, the measured value with a lower strength of the frequency component than a predetermined threshold value is removed from measurement data, so that the second processor 15B obtains monitoring data that contains only reliable measured values. Symbol ○ shown in FIG. 7 represents measured value with the strength equal to or more than the predetermined threshold value, and symbol × represents measured value with the strength lower than the predetermined threshold value. In FIG. 7, the monitoring data consists of the measured values with the symbol ○.

Every time the measured value is obtained, the strength of the frequency component corresponding to that measured value obtained is compared with the threshold value. If the strength is equal to or higher than the threshold value, the measured value (i.e., the measured value with the symbol of ○) is identified as reliable measured value by the second processor 15B. This reliable measured value is added to the monitoring data and is used in monitoring of the thickness of the silicon layer. If the strength is lower than the threshold value, the measured value (i.e., the measured value with the symbol ×) is not added to the monitoring data. As a result, the monitoring data contains only the reliable measured values.

Figure 8:
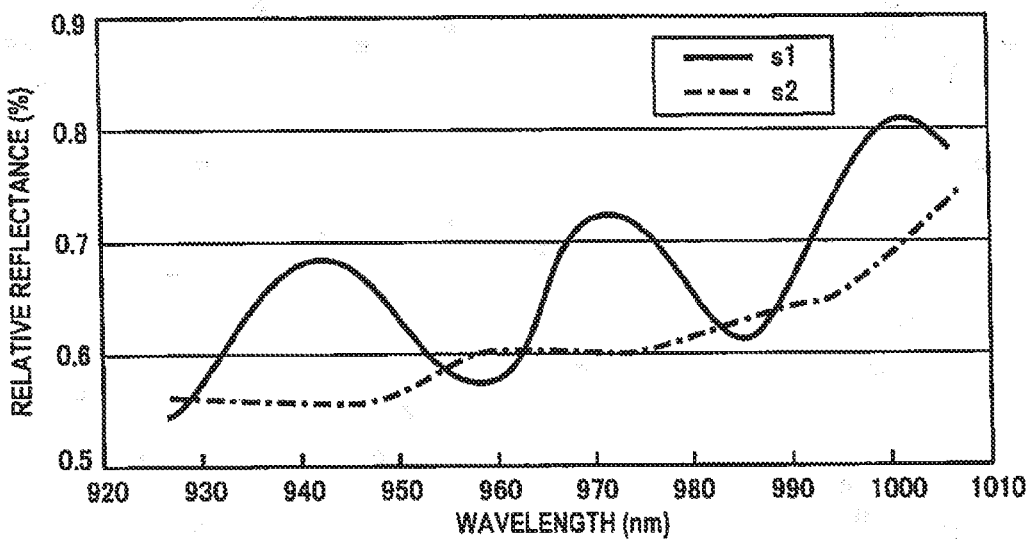
FIG. 8 is a diagram showing spectral waveforms obtained when polishing the wafer having the backside illumination (BSI) image sensor.

FIG. 8 is a diagram showing spectral waveforms obtained when polishing the wafer having the above-described backside illumination (BSI) image sensor formed thereon. FIG. 8 shows two spectral waveforms s1, s2 that are obtained in different regions on the wafer while the polishing table 20 is making one revolution. As can be seen from FIG. 8, the spectral waveform s1 contains relatively clear sine wave, while the other spectral waveform s2 does not contain clear sine wave. This is probably due to the steps formed on the surface of the silicon layer or lack of the quantity of the reflected light, as described above.

Figure 9:
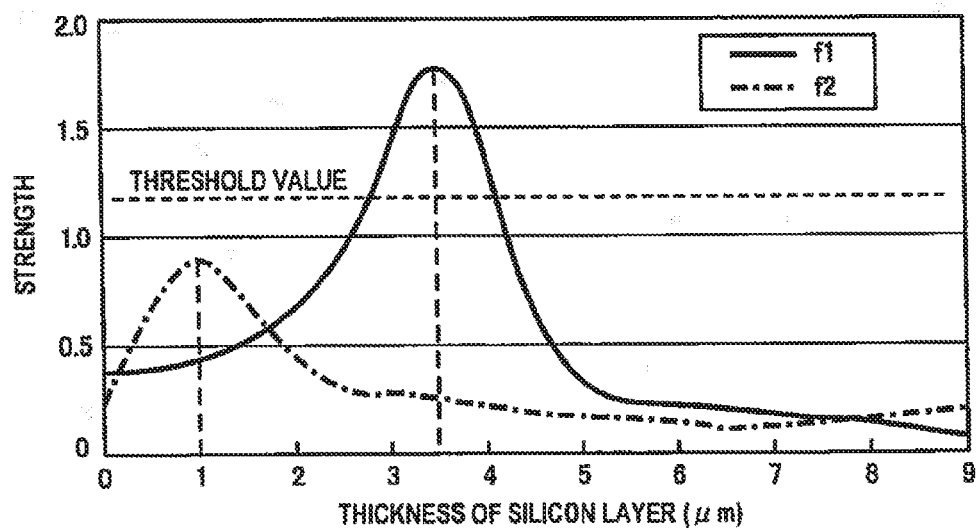
FIG. 9 is a diagram showing frequency spectra created from the spectral waveforms shown in FIG. 8.

FIG. 9 is a diagram showing frequency spectra created from the spectral waveforms shown in FIG. 8. In FIG. 9, vertical axis represents the strength of the frequency component contained in the spectral waveform, and horizontal axis represents thickness of the silicon layer converted from the frequency component. The strength of the frequency component represents a size of the sine wave forming the spectral waveform, and is approximately proportional to an amplitude of the sine wave. A frequency spectrum f1 shown in FIG. 9 corresponds to the spectral waveform s1 shown in FIG. 8, and a frequency spectrum f2 shown in FIG. 9 corresponds to the spectral waveform s2 shown in FIG. 8.

As can be seen from FIG. 9, the frequency spectrum f1 has a peak indicating that the silicon layer has a thickness of 3.5 µm. That is, the frequency spectrum f1 indicates that the silicon layer has a thickness of 3.5 µm. The frequency spectrum f2 has a peak indicating that the silicon layer has a thickness of 1 µm. Therefore, the measured value of the thickness of the silicon layer obtained from the frequency spectrum f2 is 1 µm. However, this measured value of 1 µm is greatly different from the measured value of 3.5 µm obtained from the frequency spectrum f1.

As can be seen from FIG. 8 and FIG. 9, when the spectral waveform shows clear sine wave, the frequency spectrum has a peak indicating a high strength. The spectral waveform showing the clear sine wave is considered to mean the fact that the lights shown in FIG. 2 interfere with each other without being affected by a variation in the thickness of the silicon layer. Therefore, it can be said that such spectral waveform contains accurate information of the thickness of the silicon layer. Thus, the second processor 15B removes inaccurate measured values from the measurement data based on the strength indicated by the peak of the frequency spectrum to produce the monitoring data containing only accurate measured values. More specifically, the second processor 15B selects the measured values with the strength equal to or higher than the predetermined threshold value and adds only the selected measured values to the monitoring data.

The threshold value can be determined as follows. One wafer is polished, so that the measurement data is obtained. A provisional threshold value is set for the measurement data obtained. For example, if the total number of measured values whose strength is not more than the provisional threshold value is equal to or less than 20% of the measurement data, the provisional threshold value is used as the above-mentioned threshold value.

In the example shown in FIG. 9, the threshold value is set to 1.2, while the strength indicated by the peak of the frequency spectrum f1 is about 1.8. Therefore, the measured value of 3.5 μm, which is obtained from the peak of the frequency spectrum f1, is determined to be a reliable measured value and is used as the monitoring data. On the contrary, the frequency spectrum f2 has its peak indicating the strength of about 0.9. Therefore, the measured value of 1 μm, which is obtained from the frequency spectrum f2, is not used as the monitoring data. In this manner, the measured values are sorted into reliable ones and unreliable ones based on the corresponding strength of the frequency component.

The second processor 15B receives the measurement data from the first processor 15A and produces the above-described monitoring data from the measurement data. As discussed above, the monitoring data contains only the reliable measured values. The second processor 15B monitors the measured values contained in the monitoring data and determines the polishing end point from a point of time when the measured value has reached a predetermined target value. In order to determine the polishing end point more accurately, it is preferable to calculate moving average of the reliable measured values obtained. In this case, a point of time when the moving average has reached the predetermined target value is determined to be the polishing end point. Further, in order to determine the polishing end point more accurately, it is preferable to obtain average of the reliable measured values that are obtained while the polishing table 20 makes one revolution. Further, it is preferable to obtain moving average of the average obtained.

The threshold value is preferably determined based on a plurality of measured values that have been obtained previously (i.e., in the past). More specifically, a defective data rate, which represents a percentage of the unreliable measured values, is calculated from the measured values that have been obtained previously, and the threshold value is determined such that the defective data rate is not more than a predetermined value. The defective data rate is a proportion (or a ratio) of the number of unreliable measured values to the total number of measured values that have been obtained previously (i.e., in the past). For example, in FIG. 7, the measured values that have been obtained previously are those obtained while the polishing table 20 makes five revolutions, and the total number of measured values is 25.

The number of unreliable measured values (represented by the symbol x) included in these 25 measured values is 8. Therefore, the defective data rate in this example is 32% (=8/25×100). In this example, the measured values are updated every time the polishing table 20 makes one revolution, and the measured values that are obtained during the latest five revolutions are used for the calculation of the defective data rate.

Examples of the measured values that have been obtained previously include measured values that have been already obtained when the current wafer is being polished, measured values that have been already obtained when another wafer was previously polished, and measured values that have been previously obtained in another polishing apparatus.

The defective data rate varies depending on the threshold value. Specifically, if the threshold value is set to be high, the defective data rate will increase, while if the threshold value is set to be low, the defective data rate will decrease. The threshold value is determined such that the defective data rate is not more than a predetermined value. For example, it may be preferable to set the threshold value such that the defective data rate is not more than 20%.

In the above-discussed embodiment, the threshold value is a fixed value that has been set in advance. In another embodiment, the threshold value may be varied based on a change in the defective data rate. For example, if the defective data rate has increased, the threshold value may be set to be higher. Since the increase in the defective data rate means a decrease in the reliability of the measured values as a whole, management of the measured values can be stricter by increasing the threshold value. Conversely, if the defective data rate is lowered, the threshold value may be set to be higher. Since the decrease in the defective data rate means an increase in the reliability of the measured values as a whole, increasing the threshold value can increase the reliability of the measured values while ensuring the number of reliable measured values.

In one embodiment, the second processor 15B changes the threshold value in accordance with the defective data rate using the following equation.

$$\text{Threshold value} = \text{an initial threshold value} + \text{the defective data rate} \times \alpha$$

where $\alpha$ represents a predetermined coefficient (or factor) having a plus sign or a minus sign. The initial threshold value is a preset threshold value. In the case where the coefficient $\alpha$ has a plus sign, when the defective data rate increases, the threshold value increases. In the case where the coefficient $\alpha$ has a minus sign, when the defective data rate decreases, the threshold value increases. Whether the coefficient $\alpha$ has a plus sign or a minus sign is determined based on factors including a surface state of the wafer, interconnect patterns, and the film thickness.

In this manner, by increasing the threshold value in accordance with the increase or decrease in the defective data rate, the reliability of the measured values can be improved and as a result the detection accuracy of the polishing end point can be improved. Such a renewal of the threshold value may preferably be performed regularly based on the measured values that have been obtained in the previous polishing process. For example, each time the polishing table 20 makes predetermined number of revolutions or each time a predetermined number of wafers are polished, the defective data rate may be calculated and a new threshold value may be calculated from the defective data rate obtained.

Figure 10:
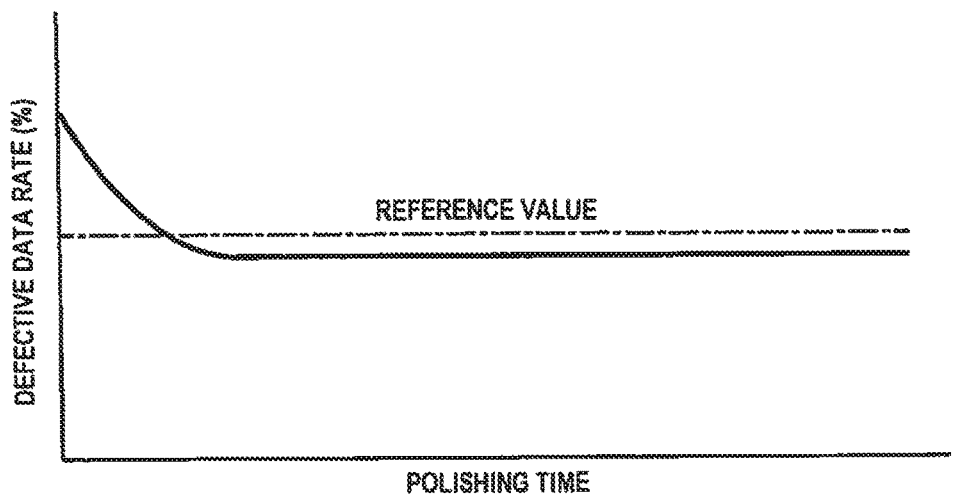
FIG. 10 is a graph showing an example of a change in defective data rate when polishing a wafer.
Figure 11:
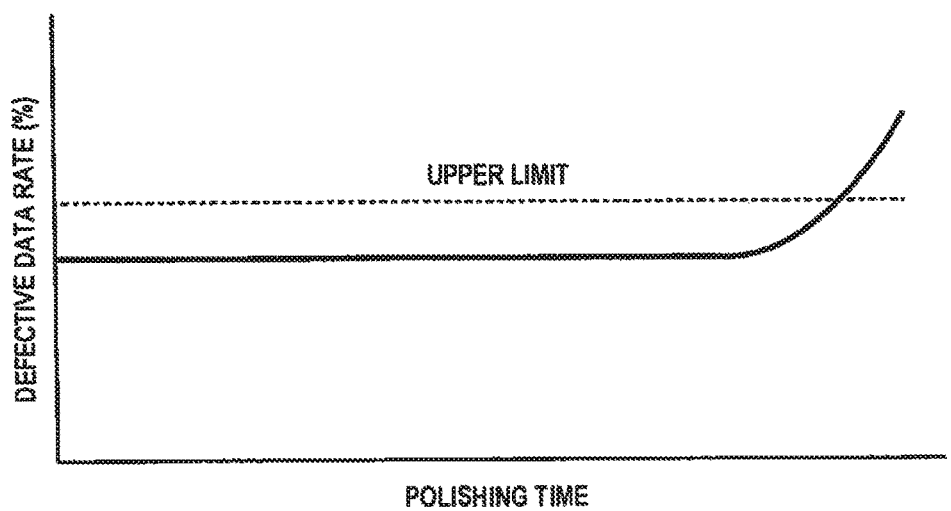
FIG. 11 is a graph showing another example of a change in defective data rate when polishing a wafer.

If polishing conditions are unchanged, the defective data rate is approximately constant from the beginning of the wafer polishing to the end of the wafer polishing. However, due to some causes, such as the surface state of the wafer or the film thickness, the defective data rate may increase at an initial stage and/or a final stage of the polishing process. For example, when polishing a wafer having a rough surface, the measured value of the film thickness is liable to increase greatly at the initial stage of the polishing process. As a result, as shown in FIG. 10, the defective data rate may increase at the initial stage of the polishing process. In another example, when the wafer polishing approaches its end point, the film thickness may decrease below a film-thickness measurable range or an underlying layer may be exposed. In such cases, the film-thickness measuring accuracy may be lowered at the final stage of the polishing process. As a result, as shown in FIG. 11, the defective data rate may increase at the final stage of the polishing process. The increase in the defective data rate results in the decrease in the number of measured values that can be used for the polishing end point detection, thus lowering the detection accuracy of the polishing end point.

Thus, as shown in FIG. 10 and FIG. 11, in order to increase the detection accuracy of the polishing end point, it is preferable to provide a reference value and/or an upper limit of the defective data rate. In the example shown in FIG. 10, the second processor 15B does not perform the polishing end point detection from the beginning of the wafer polishing until the defective data rate is lowered than the predetermined reference value. As the surface of the wafer is planarized, the defective data rate decreases, and at a certain point of time, the defective data rate is eventually lowered below the predetermined reference value. The detection of the polishing end point is started at this point of time.

In the example shown in FIG. 11, if the defective data rate reaches the predetermined upper limit after the polishing is started, the second processor 15B emits an alarm signal. In this case, the second processor 15B may stop the polishing of the wafer. Either the reference value or the upper limit may be provided, or both of them may be provided.

Figure 12:
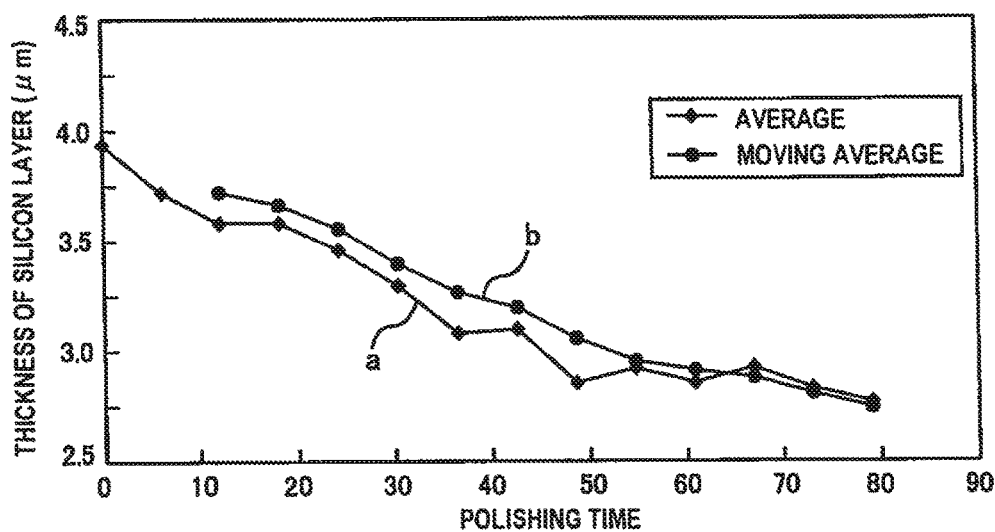
FIG. 12 is a diagram showing relationship between thickness of a silicon layer and polishing time.

FIG. 12 is a diagram showing relationship between thickness of the silicon layer (the object to be polished) and polishing time. In FIG. 12, graph a shows a temporal change in the average of the multiple measured values obtained while the polishing table 20 is making one revolution, and graph b shows a temporal change in the moving average of the above-mentioned average. The moving average is an average of the latest averages (e.g., the latest three averages). The polishing end point is a point of time when the average (the graph a) or the moving average (the graph b) of the measured values has reached the preset target value. The second processor 15B determines the polishing end point of the wafer (i.e., the polishing end point of the silicon layer) from the point of time when the average (the graph a) or the moving average (the graph b) of the measured values has reached the preset target value. As can be seen from FIG. 12, the graph b is smoother than the graph a. Therefore, in order to detect a more accurate polishing end point, it is preferable to calculate the moving average as shown by the graph b and monitor the moving average obtained.

Figure 13:
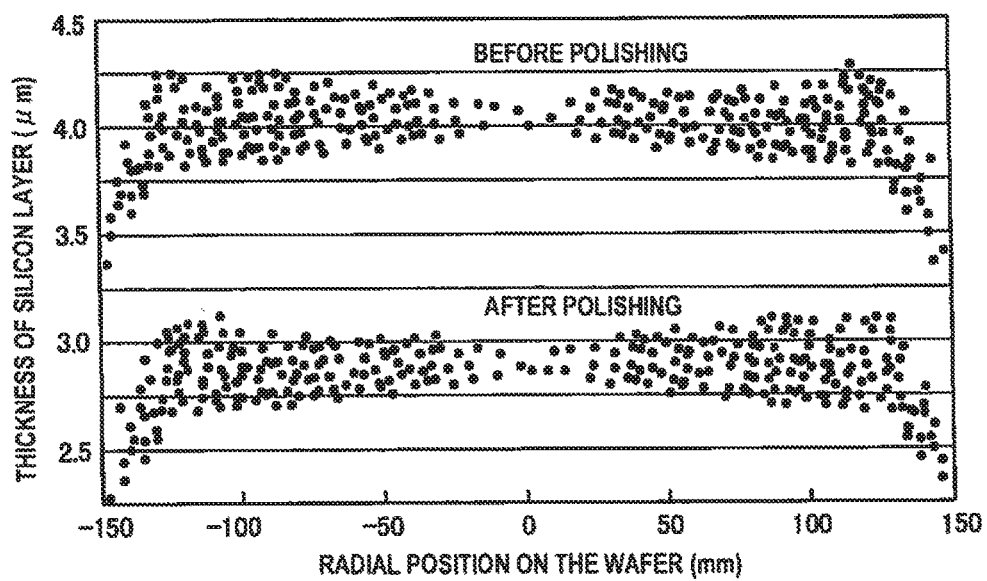
FIG. 13 is a diagram showing polishing profiles before and after polishing.

FIG. 13 is a diagram showing polishing profiles before and after polishing of the wafer. Vertical axis represents the thickness of the silicon layer, and horizontal axis represents radial position on the wafer. As shown in FIG. 13, the variation in the measured value at the central region of the wafer is relatively small. In other words, the measured values obtained in the central region of the wafer are reliable ones. Therefore, it is preferable to determine the polishing end point by using only the measured values obtained in the central region of the wafer. However, the present invention is not limited to this example. The measured values obtained in regions other than the central region of the wafer can also be used. For example, it is possible to determine the polishing end point using only the measured values obtained in a peripheral region of the wafer. Further, it is also possible to use the measured values obtained in preselected regions (e.g., the central region and the peripheral region of the wafer shown in FIG. 6).

Figure 14:
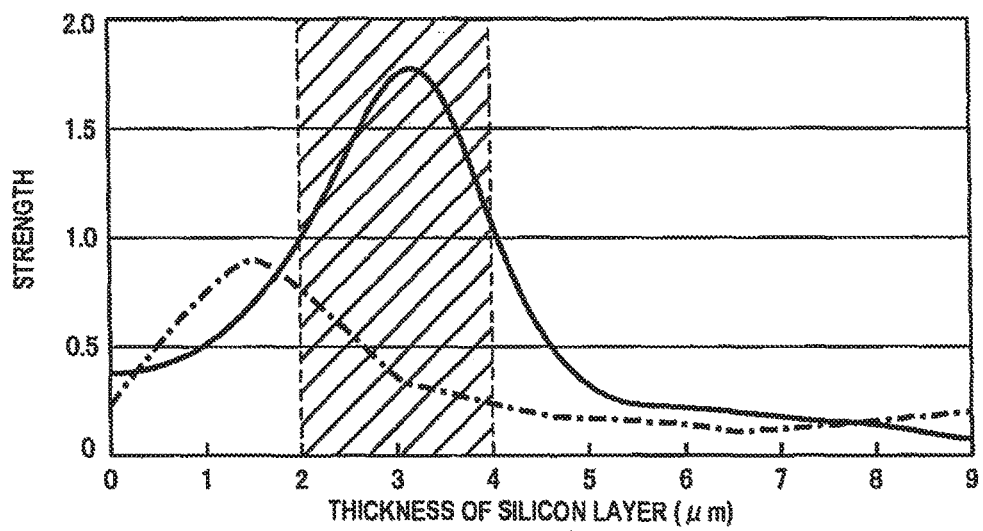
FIG. 14 is a diagram showing an example of using a predetermined threshold value with respect to strength of frequency component as a criterion for sorting measured values.

While the measured values are sorted into reliable ones and unreliable ones based on the strength of the frequency component in the example shown in FIG. 7 and FIG. 9, the measured values may be sorted based on the measured values themselves. Specifically, if the measured value obtained is within a predetermined range, that measured value is identified as the reliable measured value. For example, in a case where the thickness of the silicon layer is known (e.g., in the range of about 3 μm to 4 μm) as shown in FIG. 14, if the measured value obtained is in the range of 2.0 μm to 4.0 μm (shown by hatching in FIG. 14), that measured value can be determined to be a reliable one. On the contrary, if the measured value obtained is outside the range of 2.0 μm to 4.0 μm, that measured value can be determined to be an unreliable one. In this manner, when the thickness of the silicon layer to be polished is known, the range of the known thickness can be used as a criterion for judging the reliability of the measured value.

Figure 15:
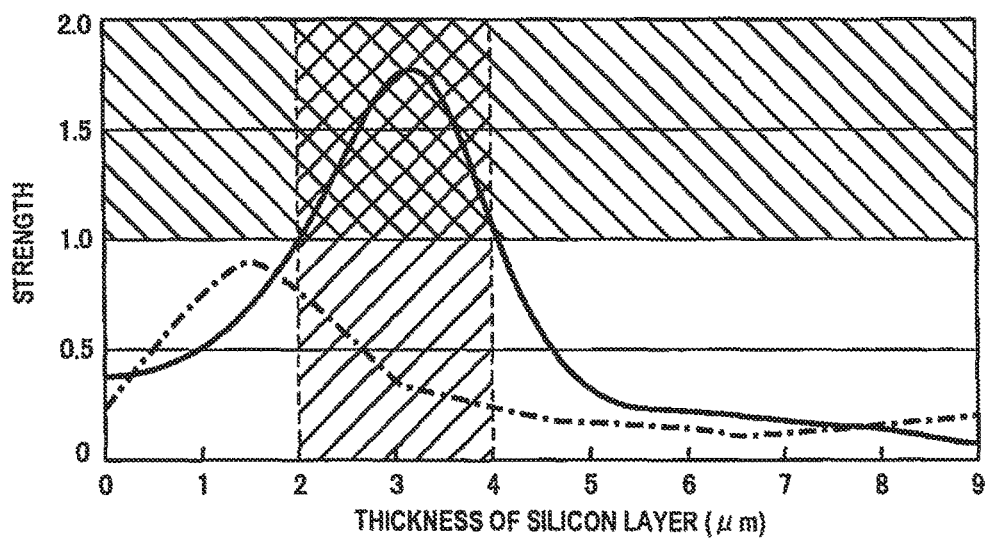
FIG. 15 is a diagram showing an example of using the predetermined threshold value with respect to the strength of the frequency component and a predetermined range with respect to thickness of the silicon layer as criteria for sorting measured values.

Further, it is also possible to use both of the predetermined threshold value with respect to the strength of the frequency component and the predetermined range with respect to the thickness of the silicon layer so as to sort the measured values obtained. FIG. 15 is a diagram showing an example of using the predetermined threshold value with respect to the strength of the frequency component and the predetermined range with respect to the thickness of the silicon layer as criteria for sorting the measured values. In this example, the threshold value with respect to the strength of the frequency component is 1 and the predetermined range with respect to the thickness of the silicon layer is from 2.0 μm to 4.0 μm. If the strength of the frequency component is equal to or higher than 1 and the thickness of the silicon layer is within the range of 2.0 μm to 4.0 μm (i.e., if the peak of the frequency spectrum lies in a mesh region shown in FIG. 15), then the measured value is determined to be reliable by the second processor 15B and is added to the monitoring data. On the contrary, if the peak of the frequency spectrum is out of the mesh region shown in FIG. 15, then the measured value is determined to be unreliable and is not added to the monitoring data.

The two spectral waveforms shown in FIG. 8 are inclined with right upward gradient in their entirety. Such inclination of the spectral waveform in its entirety appears as noise on the frequency spectrum, which prevents accurate measurement of the thickness of the silicon layer. Thus, in order to obtain the frequency spectrum with no noise, it is preferable to perform a noise removing process which includes the steps of: preparing a reference silicon wafer (bare silicon wafer); irradiating the reference silicon wafer with the infrared ray; calculating the relative reflectance at respective wavelengths of the infrared ray reflected from the reference silicon wafer to obtain a reference spectral waveform; performing the fast Fourier transform process on the reference spectral waveform to obtain a reference frequency spectrum in advance; and dividing the frequency spectrum obtained when polishing the wafer W as shown in FIG. 9 by the reference frequency spectrum to thereby obtain a frequency spectrum with no noise. More specifically, the frequency spectrum obtained during polishing is corrected by dividing the strengths of the frequency component at the respective thicknesses of the silicon layer on the currently-obtained frequency spectrum by the corresponding strengths of the frequency component on the reference frequency spectrum. It is preferable to determine the thickness of the silicon layer and the corresponding strength of the frequency component based on the corrected frequency spectrum.

Figure 16:
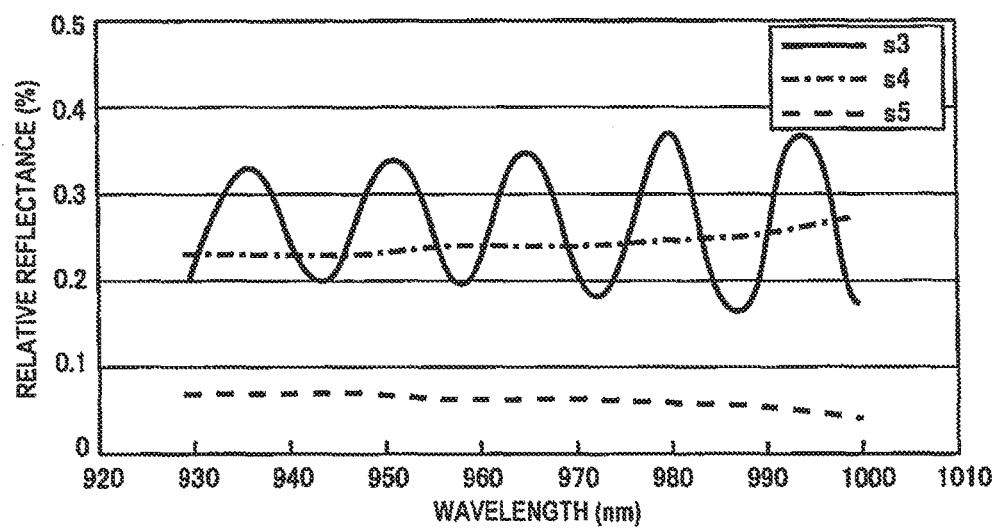
FIG. 16 is a diagram showing spectral waveforms obtained when polishing the silicon layer in fabrication process of through-silicon via (TSV)
Figure 17:
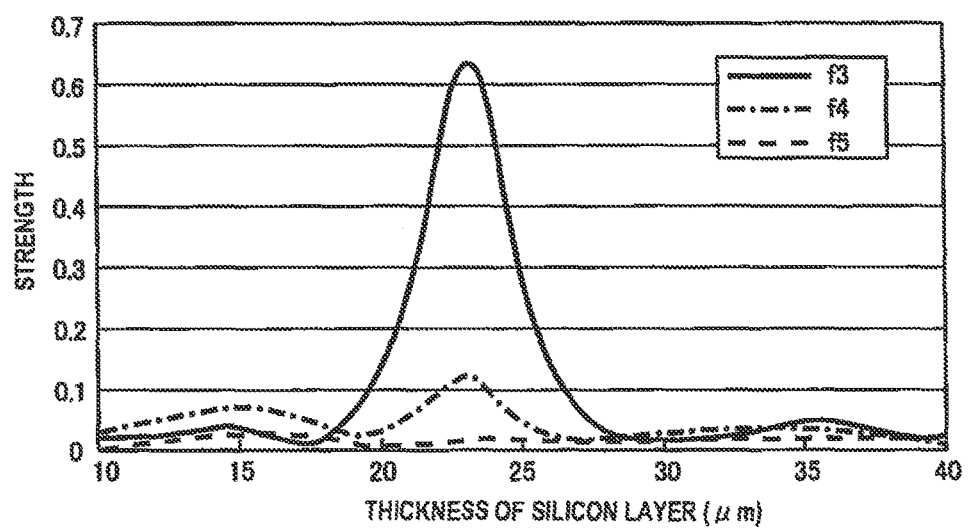
FIG. 17 is a diagram showing frequency spectra created from the spectral waveforms shown in FIG. 16.

FIG. 16 is a diagram showing the spectral waveforms obtained when polishing the silicon layer in the fabrication process of through-silicon via (TSV), and FIG. 17 is a diagram showing the frequency spectra created from the spectral waveforms shown in FIG. 16. The spectral waveforms s3, s4, and s5 in FIG. 16 correspond to the frequency spectra f3, f4, and f5 in FIG. 15, respectively. The spectral waveforms shown in FIG. 16 and the frequency spectra shown in FIG. 15 are produced in the same ways as the spectral waveform shown in FIG. 4 and the frequency spectrum shown in FIG. 5. Therefore, repetitive explanations are omitted.

In the fabrication process of through-silicon via (TSV), the thickness of the silicon layer to be polished is in the range of about 20 μm to 50 μm. In this case also, the predetermined threshold value of the strength of the frequency component and/or the predetermined range of the thickness of the silicon layer may be used as the criterion of sorting the measured values. The polishing end point detection technique according to the embodiment can be applied to both the BSI process including the polishing process of the silicon layer having a thickness of less than 10 μm and the TSV process including the polishing process of the silicon layer having a thickness in the range of about 20 μm to 50 μm.

In the case of polishing the silicon layer, the irradiator 11 preferably has the light source emitting the infrared ray. In this case, the irradiator 11 is preferably configured to switch the quantity of the infrared ray emitted from the irradiator 11. It is further preferable to change the quantity of the infrared ray in accordance with conditions of the silicon layer to be polished. The conditions of the silicon layer include the thickness of the silicon layer, a flatness of the surface of the silicon layer (i.e., uniformity of surface flatness), a thickness and a material of a film lying under the silicon layer, and a density of interconnect patterns lying under the silicon layer. For example, when polishing a thin silicon layer as in the BSI process, it is preferable to reduce the quantity of the infrared ray emitted from the irradiator 11, and when polishing a thick silicon layer as in the TSV process, it is preferable to increase the quantity of the infrared ray.

Figure 18:
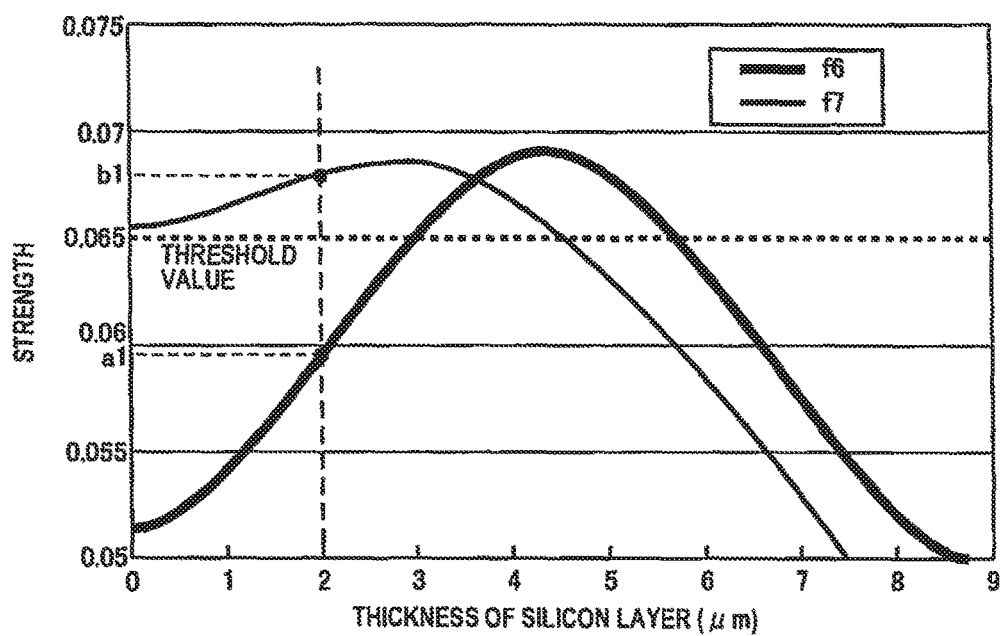
FIG. 18 is a diagram for illustrating another method of discriminating between reliable measured values and unreliable measured values.

FIG. 18 is a diagram for illustrating another method of discriminating between the reliable measured values and the unreliable measured values. FIG. 18 shows two frequency spectra f6 and f7 whose peaks indicate relatively high strengths. In this example, if the threshold value is set to 0.065, the measured values of the silicon layer thickness obtained from the frequency spectra f6 and f7 are both determined to be reliable. However, the frequency spectrum f7 has an obscure peak shape, compared with that of the frequency spectrum f6. Generally, the frequency spectrum having a clear peak shape tends to indicate a reliable measured value, while the frequency spectrum having an obscure peak shape tends to indicate an unreliable measured value.

Thus, in this method, instead of the strength at the peak of the frequency spectrum, a strength of the frequency component at a predetermined observation thickness is used to determine the reliability of the measured value. Specifically, if the strength of the frequency component at the predetermined observation thickness is lower than the threshold value, the measured value of the silicon layer thickness indicated by the peak of the frequency spectrum is determined to be reliable. On the contrary, if the strength of the frequency component at the predetermined observation thickness is equal to or higher than the threshold value, the measured value of the silicon layer thickness indicated by the peak of the frequency spectrum is determined to be unreliable.

In the example shown in FIG. 18, the predetermined observation thickness is set to 2 μm, and the threshold value is set to 0.065. In the frequency spectrum f6, a strength a1 of the frequency component at the observation thickness of 2 μm is lower than the threshold value 0.065. Therefore, the measured value obtained from the frequency spectrum f6 is determined to be reliable. On the contrary, in the frequency spectrum f7, a strength b1 of the frequency component at the observation thickness of 2 μm is higher than the threshold value 0.065. Therefore, the measured value obtained from the frequency spectrum f7 is determined to be unreliable. Plural observation thicknesses may be set. In this case, the strength at each observation thickness is compared with the above threshold value, and the reliability of the measured value is determined in the same manner as described above.

In this method, the reliability of the measured value may be determined based on the strength of the frequency component at the predetermined observation thickness, in addition to the strength at the peak of the frequency spectrum. Specifically, if the strength indicated by the peak of the frequency spectrum is higher than the predetermined threshold value and if the strength of the frequency component at the predetermined observation thickness is lower than the predetermined threshold value, the measured value of the silicon layer thickness indicated by the peak of the frequency spectrum is determined to be reliable. On the contrary, if the strength indicated by the peak of the frequency spectrum is equal to or lower than the predetermined threshold value and/or if the strength of the frequency component at the predetermined observation thickness is equal to or higher than the predetermined threshold value, the measured value of the silicon layer thickness indicated by the peak of the frequency spectrum is determined to be unreliable. In this manner, the reliability determination using the strength at the peak and the reliability determination using the strength at the predetermined observation thickness may be combined so as to realize more accurate sorting of the measured values.

Figure 19:
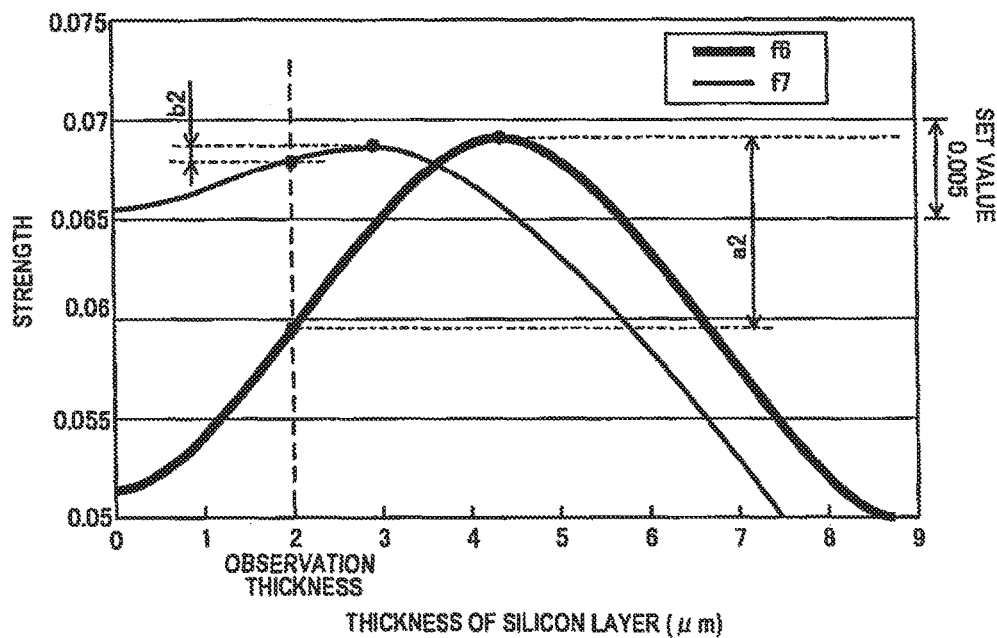
FIG. 19 is a diagram for illustrating modified example of the discrimination method shown in FIG. 18.

FIG. 19 is a diagram for illustrating modified example of the discrimination method shown in FIG. 18. In this method, a difference (absolute value) between the strength at the peak of the frequency spectrum and the strength at the predetermined observation thickness is compared with a predetermined set value. If the difference is larger than the set value, the measured value of the silicon layer thickness determined from the peak of the frequency spectrum is determined to be reliable. On the contrary, if the difference is equal to or smaller than the set value, the measured value of the silicon layer thickness determined from the peak of the frequency spectrum is determined to be unreliable.

In the example shown in FIG. 19, the set value of the above-described difference is 0.005. The difference a2 between the strength at the peak of the frequency spectrum f6 and the strength at the observation thickness of 2 μm is larger than the predetermined set value of 0.005. Therefore, the measured value of the silicon layer thickness determined from the peak of the frequency spectrum f6 is determined to be reliable. On the contrary, the difference b2 between the strength at the peak of the frequency spectrum f7 and the strength at the observation thickness of 2 μm is smaller than the predetermined set value of 0.005. Therefore, the measured value of the silicon layer thickness determined from the peak of the frequency spectrum f7 is determined to be unreliable. In this example also, plural observation thicknesses may be set.

In this method also, it is possible to combine the determination of the reliability based on the strength at the peak of the frequency spectrum and the determination of the reliability based on the above-described difference. Specifically, if the strength indicated by the peak of the frequency spectrum is higher than the predetermined threshold value and if the above-described difference is larger than the predetermined set value, the measured value of the silicon layer thickness indicated by the peak of the frequency spectrum is determined to be reliable. On the contrary, if the strength indicated by the peak of the frequency spectrum is equal to or lower than the predetermined threshold value and/or if the above-described difference is equal to or smaller than the predetermined set value, the measured value of the silicon layer thickness indicated by the peak of the frequency spectrum is determined to be unreliable.

Figure 20:
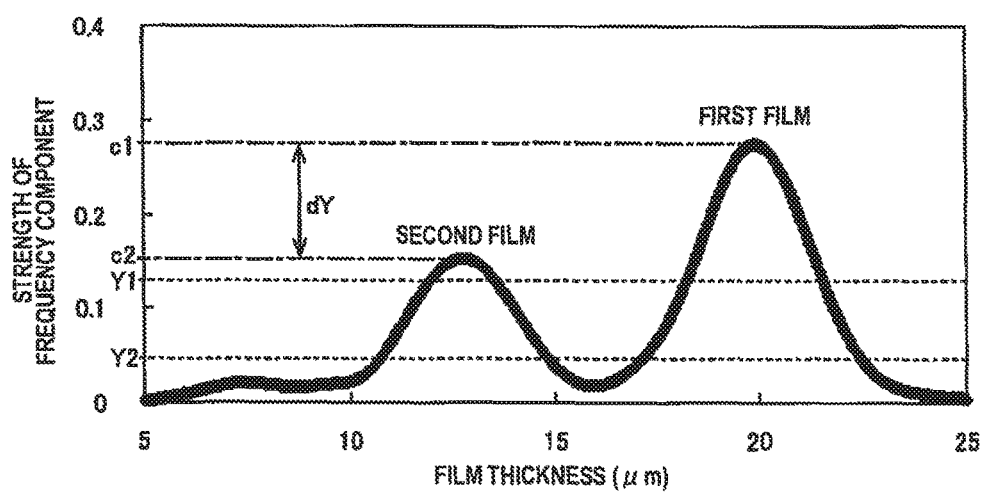
FIG. 20 is a diagram for illustrating still another method of discriminating between reliable measured values and unreliable measured values.
Figure 21:
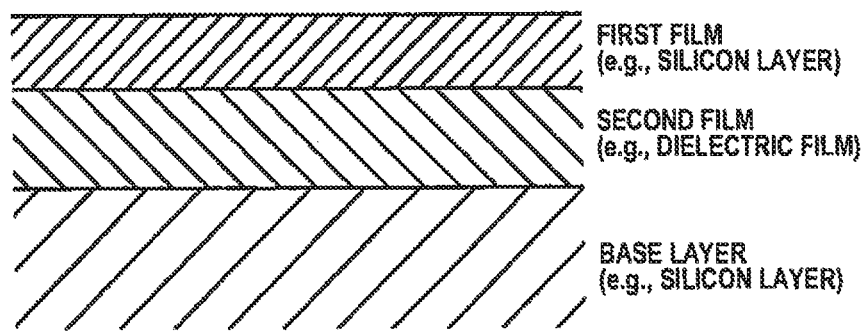
FIG. 21 is a schematic view of a multilayer structure of a wafer.

FIG. 20 is a diagram for illustrating still another method of discriminating between the reliable measured values and the unreliable measured values. Typically, a wafer has a multilayer structure as shown in FIG. 21. In the example shown in FIG. 21, a second film is formed on a base layer (e.g., a silicon layer), and a first film is formed on the second film. The target film to be polished is the uppermost first film. The first film and the second film are made of materials that allow the light to pass therethrough. For example, the first film is a silicon layer, and the second film is a dielectric film (e.g., a $SiO_2$ film). In this case, the light is reflected off a surface of the first film, an interface between the first film and the second film, and an interface between the second film and the base layer. Therefore, the reflected light from the wafer contains information about the thickness of the first film and the thickness of the second film. As a result, as shown in FIG. 20, a peak indicating the thickness of the first film and a peak indicating the thickness of the second film appear on the frequency spectrum created from the reflected light.

In this embodiment, the thickness of the second film is selected as the above-described observation thickness. This thickness of the second film is determined from the position of the peak of the frequency spectrum. The reliability of the measured value of the thickness of the first film is determined based on a difference $dY$ ($=c_1-c_2$) between an strength $c_1$ of the frequency component specified by the peak indicating the thickness of the first film and the strength $c_2$ of the frequency component specified by the peak indicating the thickness of the second film. Specifically, if the difference $dY$ is larger than a preset value, the measured value of the thickness of the first film is determined to be reliable.

In the previous embodiment the observation thickness is a fixed value, while in this embodiment the observation thickness can vary depending on the position of the peak indicating the thickness of the second film. Since the difference in the strength of the frequency component, i.e., a relative strength, is used in this embodiment, the reliability judgment of the measured value is less likely to be affected by disturbance. For example, when the illumination of the light from the illuminator 11 changes, the frequency spectrum changes in its entirety, but the difference in the strength of the frequency component is less likely to change. Therefore, the reliability of the measured values can be determined more accurately, and as a result the accuracy of the polishing end point detection can be improved.

In order to improve the reliability determination accuracy of the measured value of the thickness of the first film, the second processor 15B may preferably compare the difference $dY$ with the above-described preset value on the condition that the strength $c_1$ of the frequency component specified by the peak indicating the thickness of the first film is higher than a predetermined first lower limit Y1 and the strength $c_2$ of the frequency component specified by the peak indicating the thickness of the second film is higher than a predetermined second lower limit Y2. For example, if the strength $c_1$ of the frequency component is higher than the predetermined first lower limit Y1, the strength $c_2$ of the frequency component is higher than the predetermined second lower limit Y2, and the difference $dY$ between the strength $c_1$ and the strength $c_2$ is larger than the preset value, then the reliability of the measured value of the thickness of the first film is determined to be reliable. The first lower limit Y1 and the second lower limit Y2 may be the same value. According to this embodiment, the reliability of the measured value can be determined more accurately by determining whether the strength of the frequency component itself is higher than the lower limit or not. As a result, the accuracy of the polishing end point detection can be improved. In FIG. 20, the horizontal axis, which represents the film thickness, is expressed as value of the silicon layer thickness converted with use of an index of refraction of silicon. This is because the second film is a dielectric film and therefore the value of the thickness of the second film shown in FIG. 20 represents the thickness that has been converted into the silicon layer thickness.

Figure 22:
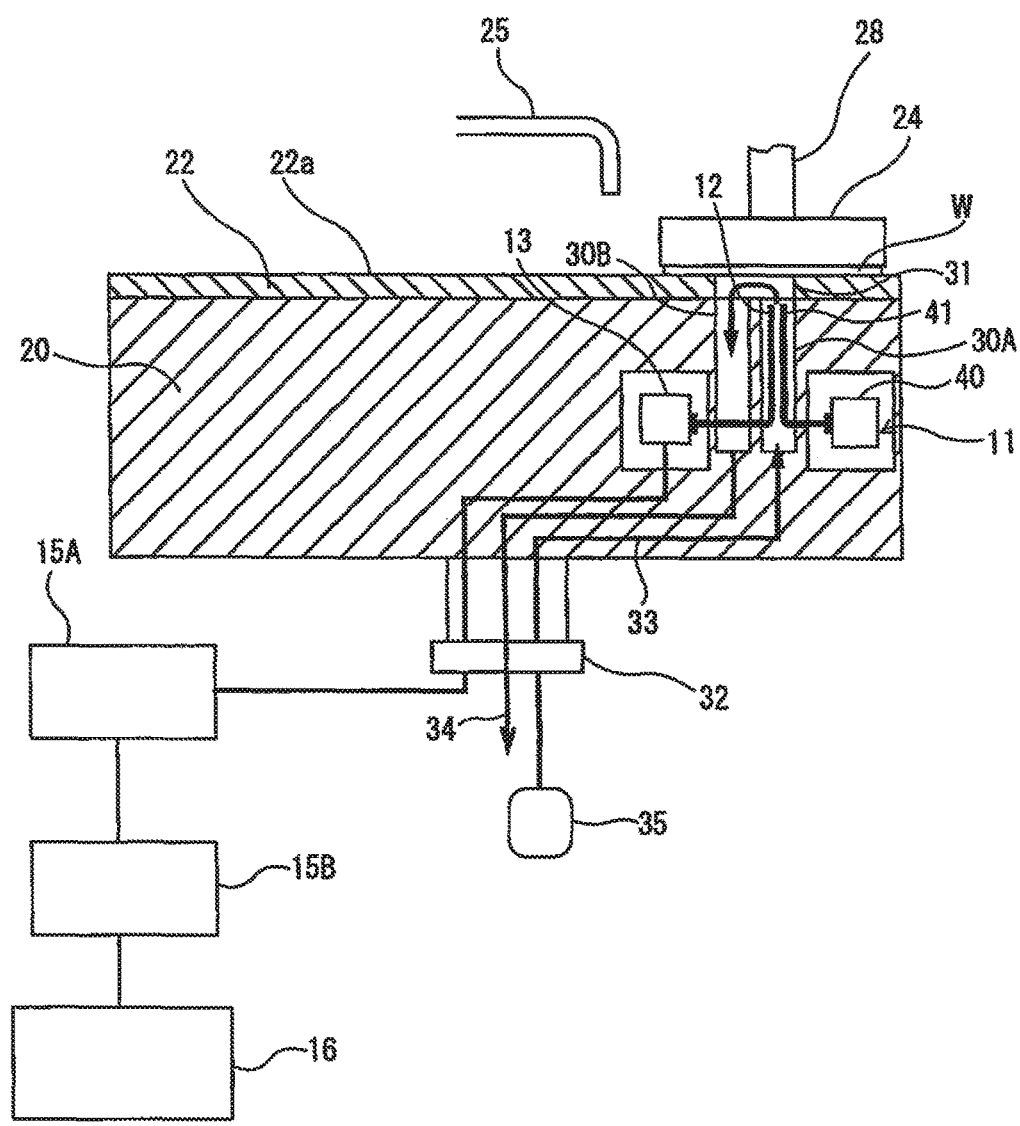
FIG. 22 is a cross-sectional view schematically showing a polishing apparatus.

FIG. 22 is a cross-sectional view schematically showing a polishing apparatus that can perform the above-discussed polishing end point detection methods. As shown in FIG. 22, the polishing apparatus includes the polishing table 20 for supporting the polishing pad 22 thereon, a top ring 24 configured to hold the wafer W and press the wafer W against the polishing pad 22, and a polishing liquid supply nozzle 25 configured to supply a polishing liquid (slurry) onto the polishing pad 22. The polishing table 20 is coupled to a motor (not shown in the drawing) provided below the polishing table 20, so that the polishing table 20 can rotate about its own axis. The polishing pad 22 is secured to an upper surface of the polishing table 20.

The polishing pad 22 has an upper surface 22a, which provides a polishing surface for polishing the wafer W. The top ring 24 is coupled to a motor and an elevating device (not shown in the drawing) through a top ring shaft 28. With these configurations, the top ring 24 can move in the vertical direction and can rotate about the top ring shaft 28. The top ring 24 has a lower surface which is configured to hold the wafer W by vacuum suction or the like.

The wafer W, held on the lower surface of the top ring 24, is rotated by the top ring 24, and is pressed by the top ring 24 against the polishing surface 22a of the polishing pad 22 on the rotating polishing table 20. Simultaneously, the polishing liquid is supplied onto the polishing surface 22a of the polishing pad 22 from the polishing liquid supply nozzle 25. The surface of the wafer W is polished in the presence of the polishing liquid between the surface of the wafer W and the polishing pad 22. A relative movement mechanism for providing sliding contact between the wafer W and the polishing pad 22 is constructed by the polishing table 20 and the top ring 24.

The polishing table 20 has a first hole 30A and a second hole 30B each having an upper open end lying in the upper surface of the polishing table 20. The polishing pad 22 has a through-hole 31 at a position corresponding to the holes 30A and 30B. The holes 30A and 30B are in fluid communication with the through-hole 31, which has an upper open end lying in the polishing surface 22a. The first hole 30A is coupled to a liquid supply source 35 via a liquid supply passage 33 and a rotary joint 32. The second hole 30B is coupled to a liquid discharge passage 34.

During polishing of the wafer W, the liquid supply source 35 supplies water (preferably pure water) as a transparent liquid into the first hole 30A and the through-hole 31. The water fills a space formed between the lower surface of the wafer W and tip ends of optical fibers 12 and 41. The water further flows into the second hole 30B and is expelled through the liquid discharge passage 34. The polishing liquid is discharged together with the water and thus a path of light is secured. The liquid supply passage 33 is provided with a valve (not shown in the drawing) configured to operate in conjunction with the rotation of the polishing table 20. The valve operates so as to stop the flow of the water or reduce the flow of the water when the wafer W is not located over the through-hole 31. In this embodiment, the liquid supply source 35 and the liquid supply passage 33 serve as a water supply mechanism.

The polishing apparatus has a polishing monitoring unit for monitoring the progress of the polishing process and detecting the polishing end point according to the above-discussed method. This polishing monitoring unit includes the irradiator 11 for irradiating the surface, to be polished, of the wafer W with the light, the optical fiber 12 as the optical receiver for receiving the light reflected from the wafer W, the spectroscope 13 configured to resolve the reflected light according to the wavelength and measure the intensity of the reflected light over a predetermined wavelength range, the first processor 15A configured to determine the thickness of the film from the light intensity data obtained by the spectroscope 13, and the second processor 15B configured to monitor the thickness of the film obtained from the first processor 15A and determine the polishing end point of the wafer W (i.e., the polishing end point of the film). The first processor 15A and the second processor 15B may be provided as one processor.

The irradiator 11 includes a light source 40 and the optical fiber 41 coupled to the light source 40. The optical fiber 41 is an optical transmission element for directing the light, emitted from the light source 40, to the surface of the wafer W. The tip ends of the optical fiber 41 and the optical fiber 12 are arranged in the first hole 30A and are located near the surface, to be polished, of the wafer W. The tip ends of the optical fiber 41 and the optical fiber 12 are oriented toward the center of the wafer W held by the top ring 24, so that multiple regions, including the center of the wafer W, are irradiated with the light each time the polishing table 20 makes one revolution as shown in FIG. 3 and FIG. 6. In the case where the film to be polished is a silicon layer, it is preferable to use light having a wavelength of not more than 1100 nm which can travel through water relatively easily.

A light emitting diode (LED), a halogen lamp, a xenon lamp, or the like can be used as the light source 40. The optical fiber 41 and the optical fiber 12 are arranged in parallel with each other. The tip ends of the optical fiber 41 and the optical fiber 12 are approximately perpendicular to the surface of the wafer W, so that the optical fiber 41 directs the light to the surface of the wafer W perpendicularly.

During polishing of the wafer W, the irradiator 11 irradiates the wafer W with the light, and the optical fiber 12 receives the light reflected from the wafer W. During the irradiation, the water is supplied into the holes 30A and 30B and the through-hole 31 to fill the space between the surface of the wafer W and the tip ends of the optical fibers 41 and 12. The spectroscope 13 measures the intensity of the reflected light over the predetermined wavelength range and sends the light intensity data to the first processor 15A, which performs the FFT (fast Fourier transform) process on the spectral waveform as described above to determine the thickness of the film. The second processor 15B determines the polishing end point based on the thickness of the film obtained from the first processor 15A.

Figure 23:
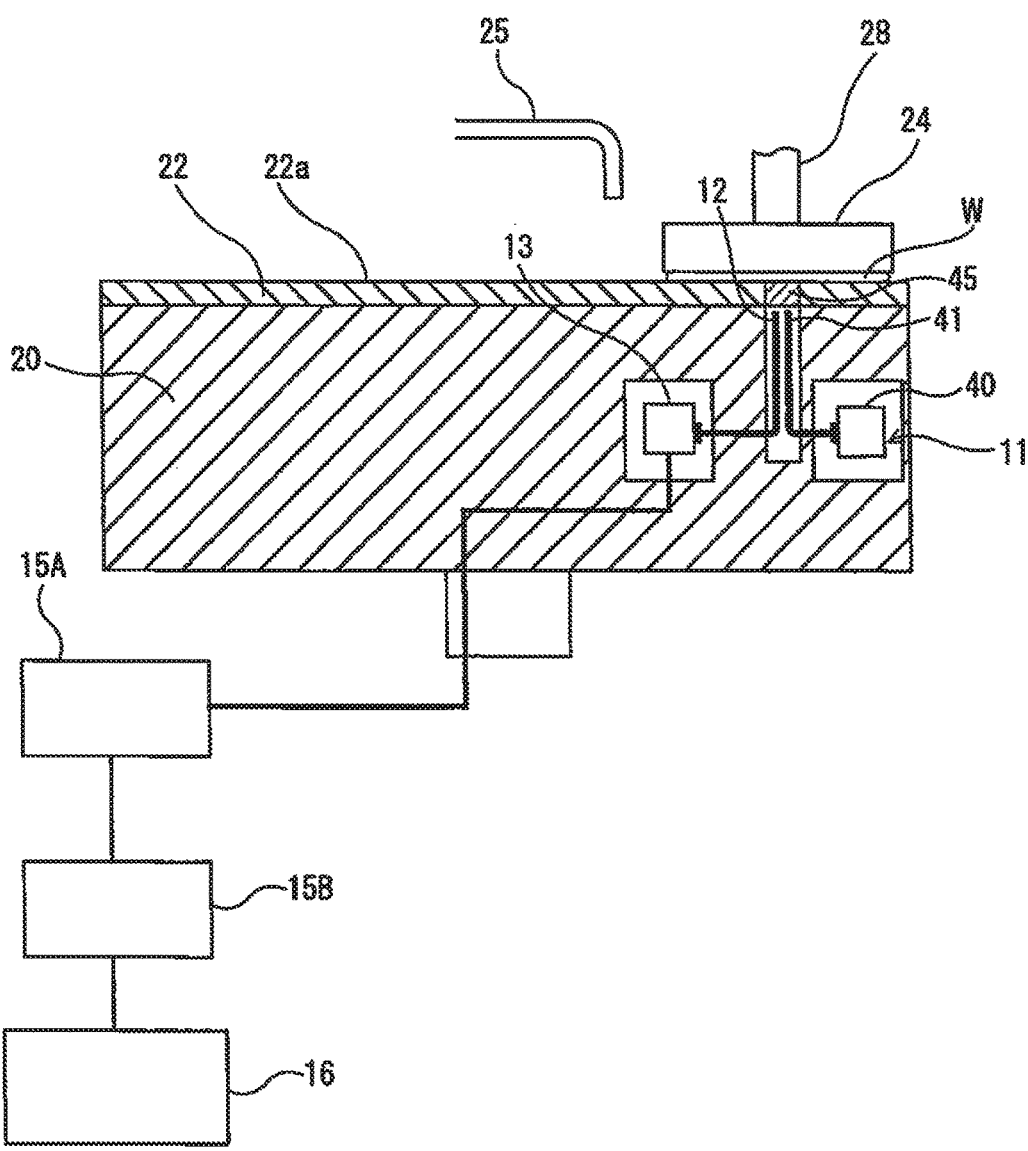
FIG. 23 is a cross-sectional view of a modified example of the polishing apparatus shown in FIG. 22.

FIG. 23 is a cross-sectional view showing a modified example of the polishing apparatus shown in FIG. 22. In the example shown in FIG. 23, the liquid supply passage, the liquid discharge passage, and the liquid supply source are not provided. Instead, a transparent window 45 is provided in the polishing pad 22. The optical fiber 41 of the irradiator 11 directs the light to the surface of the wafer W on the polishing pad 22 through the transparent window 45, and the optical fiber 12 as the optical receiver receives the light reflected from the wafer W through the transparent window 45. The other structures are the same as those of the polishing apparatus shown in FIG. 22.

Examples of a wafer (or a substrate) that can be used in the above-discussed embodiments include a wafer having a single-layer dielectric film or a multilayer dielectric film formed on a surface thereof, a wafer for use in fabrication of backside illumination (BSI) image sensor, and a wafer for use in fabrication of through-silicon via (TSV). If the film to be polished is a silicon layer, infrared ray is preferably used as the light to be applied to the wafer. The silicon layer may be a silicon substrate itself. The present invention is applicable to polishing (or grinding) of the silicon substrate itself. For example, the present invention can be applied to a process of grinding a back-side surface of the silicon substrate. An apparatus for polishing (or grinding) the silicon substrate uses a bonded abrasive (or grindstone) as the polishing tool, instead of the polishing pad 22.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:

1. A method of polishing a substrate having a film, the method comprising:
   polishing the substrate by pressing the substrate against a polishing tool on a rotating polishing table;
   irradiating the substrate with light when polishing the substrate;
   receiving the light reflected from the substrate;
   measuring intensity of the reflected light at respective wavelength, the reflected light having wavelengths of not more than 1100 nm;
   calculating relative reflectance by dividing the measured intensity of the light by predetermined reference intensity;

producing spectral waveform representing relationship between the relative reflectance and wavelength of the light;

performing a Fourier transform process on the spectral waveform to determine a thickness of the film and a corresponding strength of frequency component; and determining a polishing end point of the substrate based on a point in time at which the determined thickness of the film has reached a predetermined target value.

2. The method according to claim 1, further comprising:

determining that the determined thickness of the film is a reliable measured value if the strength of frequency component is higher than a predetermined threshold value;

determining that the determined thickness of the film is an unreliable measured value if the strength of frequency component is equal to or lower than the predetermined threshold value; and determining the polishing end point of the substrate based on a point in time at which the reliable measured value has reached the predetermined target value.

3. The method according to claim 2, further comprising:

calculating a defective data rate representing a proportion of the number of unreliable measured values to the total number of reliable measured values and unreliable measured values that have been obtained previously; and changing the predetermined threshold value based on the defective data rate.

4. The method according to claim 3, wherein changing the predetermined threshold value based on the defective data rate comprises increasing the predetermined threshold value in accordance with an increase in the defective data rate.

5. The method according to claim 3, wherein changing the predetermined threshold value based on the defective data rate comprises increasing the predetermined threshold value in accordance with a decrease in the defective data rate.

6. The method according to claim 3, wherein the polishing end point is not determined from the beginning of polishing of the substrate until the defective data rate is lowered below a predetermined reference value.

7. The method according to claim 3, further comprising:

emitting an alarm signal if the defective data rate has reached a predetermined upper limit during polishing of the substrate.

8. The method according to claim 7, further comprising:

stopping polishing of the substrate if the defective data rate has reached the predetermined upper limit during polishing of the substrate.

9. The method according to claim 1, wherein the film comprises one of a dielectric film, a metal film, and a silicon layer.

* * * * *